United States Patent
Yang

(10) Patent No.: US 6,762,699 B1
(45) Date of Patent: Jul. 13, 2004

(54) METHOD FOR LOSSLESS DATA COMPRESSION USING GREEDY SEQUENTIAL GRAMMAR TRANSFORM AND SEQUENTIAL ENCODING

(75) Inventor: En-hui Yang, Waterloo (CA)

(73) Assignee: The Directv Group, Inc., El Segundo, CA (US)

( * ) Notice: Subject to any disclaimer, the term of this patent is extended or adjusted under 35 U.S.C. 154(b) by 809 days.

(21) Appl. No.: 09/711,703

(22) Filed: Nov. 14, 2000

Related U.S. Application Data

(60) Provisional application No. 60/172,127, filed on Dec. 17, 1999.

(51) Int. Cl.[7] ............................................... H03M 7/34
(52) U.S. Cl. ............................ 341/51; 341/50; 341/106
(58) Field of Search ........................... 341/50, 51, 106

(56) References Cited

U.S. PATENT DOCUMENTS

| | | | |
|---|---|---|---|
| 5,321,606 A | 6/1994 | Kuruma et al. | 364/419.08 |
| 5,583,762 A | 12/1996 | Shafer | 395/794 |
| 5,678,052 A | 10/1997 | Brisson | 395/754 |
| 5,687,384 A | 11/1997 | Nagase | 395/759 |
| 5,970,449 A | 10/1999 | Alleva et al. | 704/235 |
| 6,400,289 B1 * | 6/2002 | Banerji | 341/60 |
| 6,492,917 B1 * | 12/2002 | Goel et al. | 341/60 |

OTHER PUBLICATIONS

Yang, En–Hui et al., "Efficient Universal Lossless Data Compression Algorithms Based on a Greedy Sequential Grammar Transform—Part One: Without Context Models", IEEE Transactions on Information Theory, vol. 46, No. 3, May 2000, pp. 755–777.

Kieffer, John C. et al., "Grammar–Based Codes: A New Class of Universal Lossless Source Codes", IEEE Transactions on Information Theory, vol. 46, No. 3, May 2000, pp. 737–754.

* cited by examiner

*Primary Examiner*—Michael Tokar
*Assistant Examiner*—Nguyen Khai
(74) *Attorney, Agent, or Firm*—John T. Whelan

(57) ABSTRACT

A method of lossless data compression is provided which uses a grammar transform to sequentially construct a sequence of irreducible context-free grammars from which an original data sequence can be recovered incrementally. The data sequence is encoded using any one of a sequential encoding method, an improved sequential encoding method and a hierarchical encoding method.

27 Claims, 14 Drawing Sheets

METHOD FOR LOSSLESS DATA COMPRESSION USING GREEDY SEQUENTIAL GRAMMAR TRANSFORM AND SEQUENTIAL ENCODING

This application claims the benefit of provisional U.S. application Ser. No. 60/172,127, filed Dec. 17, 1999.

FIELD OF THE INVENTION

The present invention relates to a method of encoding a data sequence by converting the data sequence into a grammar transform and then losslessly encoding the data sequence based on the grammar transform.

BACKGROUND OF THE INVENTION

Universal data compression methods can be divided into two subdivisions: universal loss less data compression and universal lossy data compression. Conventional universal lossless data compression methods typically employ arithmetic coding algorithms, Lempel-Ziv algorithms, and their variants. Arithmetic coding algorithms and their variants are statistical model-based algorithms. To use an arithmetic coding algorithm to encode a data sequence, a statistical model is either built dynamically during the encoding process, or assumed to exist in advance. Several approaches have been proposed to dynamically build a statistical model. These include the prediction by partial match algorithm, dynamic Markov modeling, context gathering algorithm, and context-tree weighting method. In all of these methods, the next symbol in the data sequence is typically predicted by a proper context and coded by the corresponding estimated conditional probability. Good compression can be achieved if a good trade-off is maintained between the number of contexts and the conditional entropy of the next symbols given contexts during the encoding process. Arithmetic coding algorithms and their variants are universal only with respect to the class of Markov sources with Markov order less than some designed parameter value. Note that in arithmetic coding, the original data sequence is encoded letter by letter. In contrast, no statistical model is used in Lempel-Ziv algorithms and their variants. During the encoding process, the original data sequence is parsed into non-overlapping, variable-length phrases according to a string matching mechanism, and then encoded phrase by phrase. Each parsed phrase is either distinct or replicated with the number of repetitions less than or equal to the size of the source alphabet. Phrases are encoded in terms of their positions in a dictionary or database. Lempel-Ziv algorithms are universal with respect to a class of sources which is broader than the class of Markov sources of bounded order; the incremental parsing Lempel-Ziv algorithm is universal for the class of stationary, ergodic sources. Other conventional universal compression methods include the dynamic Huffman algorithm, the move-to-front coding scheme, and some two stage compression algorithms with codebook transmission. These conventional methods are either inferior to arithmetic coding and Lempel-Ziv algorithms, or too complicated to implement. Recently, J. C. Kieffer and E. H. Yang proposed a class of lossless data compression algorithms based on substitution tables in "Lossless Data Compression Algorithms Based on Substitution Tables", *Proc. of the* 1998 *Canadian Conference on Electrical and Computer Engineering*(Waterloo, Ontario), Vol. 2, pp. 629–632, May 24–28, 1998. In this paper, a new coding framework is presented, but no explicit data compression algorithm is proposed. The greedy sequential transformation discussed in the paper is difficult to implement and does not facilitate subsequent efficient coding, since the symbol $s_0$ is involved in the parsing process.

SUMMARY OF THE INVENTION

In accordance with the present invention, a universal lossless data compression method is provided to overcome the above-described disadvantages of existing compression methods. The compression method of the present invention utilizes a grammar transform to sequentially construct a sequence of irreducible context-free grammars from which an original data sequence can be recovered incrementally. Based on the grammar transform, the data sequence is encoded using sequential or hierarchical encoding methods.

BRIEF DESCRIPTION OF THE DRAWINGS

Preferred embodiments of the present invention are described in detail below with reference to the attached drawing figures, in which.

DESCRIPTION OF THE PREFERRED EMBODIMENTS

Figure 1:
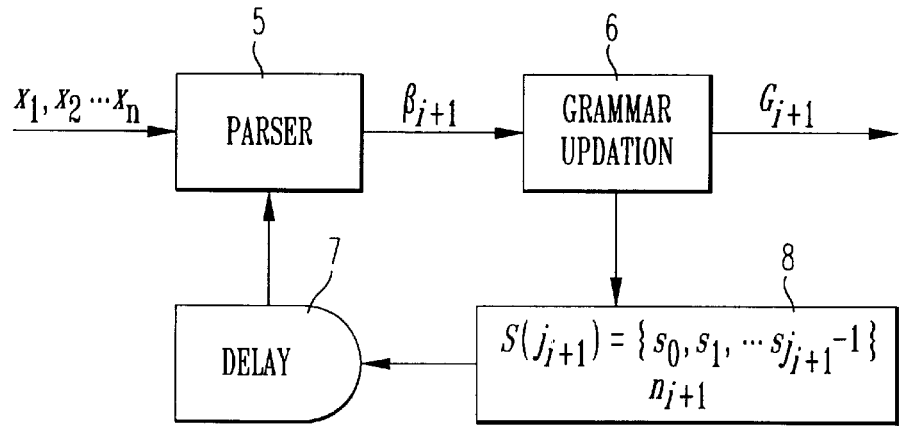
FIG. 1 is a flow chart illustrating a sequence of operations for a grammar transform in accordance with an embodiment of the present invention.

Prior to describing the methods of the present invention in detail, terms and notation used will now be described. Let A be a source alphabet with cardinality greater than or equal to 2. Let $A^*$ be the set of all finite strings drawn from A, including the empty string $\lambda$, and $A^+$ the set of all finite strings of positive length from A. The notation $|A|$ stands for the cardinality of A, and for any $x \in A^*$, $|x|$ denotes the length of x. For any positive integer n, $A^n$ denotes the set of all sequences of length n from A. To avoid possible confusion, a sequence from A is sometimes called an A-sequence. The source alphabet A is of course application-dependent. Without loss of generality, it is assumed that $A = \{0, 1, \ldots, |A|, A|1\}$. In most applications, $|A|=256$. Fix a countable set $S=\{s_0, s_1, s_2, \ldots, \}$ of symbols, disjoint from A. (In a typical implementation, one may select S as $\{|A|, |A|+1, |A|+2, \ldots, \}$.) Symbols in S will be called variables; symbols in A will be called terminal symbols. For any $j \geq 1$, let $S(j) = \{s_0, s_1, \ldots, s_{j-1}\}$. A context-free grammar G is a mapping from S(j) to $(S(j) \cup A)^+$ for some $j \geq 1$. The set S(j) shall be called the variable set of G and, to be specific, the elements of S(j) shall be called sometimes G-variables. To describe the mapping explicitly, for each $s_i(i<j)$, the relationship $(s_i, G(s_i))$ is written as $s_i \rightarrow G(s_i)$, and referred to as a production rule. Thus the grammar G is completely described by the set of production rules $\{s_i \rightarrow G(s_i): 0 \leq i \leq j\}$. Start with the variable so. By replacing in parallel each variable s in $G(s_0)$ by $G(s)$, another sequence from $S(j) \cup A$ is obtained. If this parallel replacement procedure is repeatedly performed, one of the following will hold:

(1) After finitely many parallel replacement steps, a sequence from A is obtained; or (2) the parallel replacement procedure never ends because each string so obtained contains an entry which is a G-variable.

For the purpose of data compression, the focus is on grammars G for which the parallel replacement procedure terminates after finitely many steps and every G-variable $s_i(i<j)$ is replaced at least once by $G(s_i)$ in the whole parallel replacement process. Such grammars G are called admissible grammars and the unique sequence from A resulting from the parallel replacement procedure is called a sequence represented by G or by $s_0$. Since each variable si is replaced at least once by $G(s_i)$, it is easy to see that each variable $s_i(i \neq 0)$ represents a substring of the A-sequence represented by $s_0$, as shown in the following example.

EXAMPLE 1

Let A={0, 1}. Below is an example of an admissible grammar G with variable set $\{s_0, s_1, s_2, s_3\}$.

$s_0 \to 0 s_3 s_2 s_1 s_1 s_3 10$
$s_1 \to 01$
$s_2 \to s_1 1$
$s_3 \to s_1 s_2$

Perform the following parallel replacements:

$$s_0 \xrightarrow{G} 0s_3 s_2 s_1 s_1 s_3 10$$
$$0s_3 s_2 s_1 s_1 s_3 10 \xrightarrow{G} 0s_1 s_2 s_1 10101 s_1 s_2 10$$
$$0s_1 s_2 s_1 10101 s_1 s_2 10 \xrightarrow{G} 001 s_1 1011010101 s_1 110$$
$$001 s_1 1011010101 s_1 110 \xrightarrow{G} 00101101101010101110$$

In the above, start with so and then repeatedly apply the parallel replacement procedure. After four steps, (e.g., each appearance of the notation $\xrightarrow{G}$ represents one step of parallel replacements), a sequence from A is obtained and the parallel replacement procedure terminates. Also, each variable $s_i(0 \leq i<4)$ is replaced at least once by $G(s_i)$ in the whole parallel replacement process. Therefore in this example, $s_0$ (or G) represents the sequence x=00101101101010101110. Each of the other G-variables represents a substring of x: $s_1$ represents 01, $s_2$ represents 011, and $s_3$ represents 01011.

An admissible grammar G is said to be irreducible if the following conditions are satisfied (1) Each G-variable s other than $s_0$ appears at least twice in the range of G.

(2) There is no non-overlapping repeated pattern of length greater than or equal to 2 in the range of G.

(3) Each distinct G-variable represents a distinct A-sequence.

The admissible grammar shown in Example 1 is irreducible.

A grammar transform is a transformation that converts any data sequence $x \in A^+$ into an admissible grammar $G_x$ that represents x. A grammar transform is said to be irreducible if $G_x$ is irreducible for all $x \in A^+$.

Starting with an admissible grammar G that represents x, a set of reduction rules can be repeatedly applied to generate another admissible grammar G' which represents the same x and satisfies Properties (1) to (3) above. This set of reduction rules is described below.

Reduction Rule 1. Let s be a variable of an admissible grammar G that appears only once in the range of G. Let s'→X ceso be the unique production rule in which s appears on the right. Let s→γ be the production rule corresponding to s. Reduce G to the admissible grammar G' obtained by removing the production rule s→γ from G and replacing the production rule s'→αsβ with the production rule s'→αγβ. The resulting admissible grammar G' represents the same sequence x as does G.

EXAMPLE 2

Consider the grammar G with variable set $\{s_0, s_1, s_2\}$ given by $\{s_0 \to s_1 s_1, s_1 \to s_2 1, s_2 \to 010\}$. Applying Reduction Rule 1, one gets the grammar G' with variable set $\{s_0, s_1\}$ given by $\{s_0 \to s_1 s_1, s_1 \to 0101\}$.

Reduction Rule 2. Let G be an admissible grammar possessing a production rule of form $s \to \alpha_1 \beta \alpha_2 \beta \alpha_3$, where the length of β is at least 2. Let s'∈S be a variable which is not a G-variable. Reduce G to the grammar G' obtained by replacing the production rule $s \to \alpha_1 \beta \alpha_2 \beta \alpha_3$ of G with $s \to \alpha_1 s' \alpha_2 s' \alpha_3$, and by appending the production rule s'→β. The resulting grammar G' includes a new variable s' and represents the same sequence x as does G.

EXAMPLE 3

Consider the grammar G with variable set $\{s_0, s_1\}$ given by $\{s_0 \to s_1 01 s_1 01, s_1 \to 11\}$. Applying Reduction Rule 2, one gets the grammar G' with variable set $\{s_0, s_1, s_2\}$ given by $\{s_0 \to s_1 s_2 s_1 s_2, s_1 \to 11, s_2 \to 01\}$.

Reduction Rule 3. Let G be an admissible grammar possessing two distinct production rules of form $s \to \alpha_1 \beta \alpha_2$ and $s' \to \alpha_3 \beta \alpha_4$, where β is of length at least two, either $\alpha_1$ or $\alpha_2$ is not empty, and either $\alpha_3$ or $\alpha_4$ is not empty. Let s"∈S be a variable which is not a G-variable. Reduce G to the grammar G' obtained by doing the following: Replace rule $s \to \alpha_1 \beta \alpha_2$ by $s \to \alpha_1 s'' \alpha_2$, replace rule $s' \to \alpha_3 \beta \alpha_4$ by $s' \to \alpha_3 \beta \alpha_4$, and append the new rule s"→β.

EXAMPLE 4

Consider the grammar G with variable set $\{s_0, s_1, s_2\}$ given by $\{s_0 \to s_1 0 s_2, s_1 \to 10, s_2 \to 0 s_1 0\}$. Applying Reduction Rule 3, one gets the grammar G' with variable set $\{s_0, s_1, s_2, s_3\}$ given by $\{s_0 \to s_3 s_2, s_1 \to 10, s_2 \to 0 s_3, s_3 \to s_1 0\}$.

Reduction Rule 4. Let G be an admissible grammar possessing two distinct production rules of the form $s \to \alpha_1 \beta \alpha_2$ and s'→β, where β is of length at least two, and either $\alpha_1$ or $\alpha_2$ is not empty. Reduce G to the grammar G' obtained by replacing the production rule $s \to \alpha_1 \beta \alpha_2$ with the production rule $s \to \alpha_1 s' \alpha_2$.

EXAMPLE 5

Consider the grammar G with variable set $\{s_0, s_1, s_2\}$ given by $\{s_0 \to s_2 01 s_1, s_1 \to s_2 0, s_2 \to 11\}$. Applying Reduction Rule 4, one gets the grammar G' with variable set $\{s_0, s_1, s_2\}$ given by $\{s_0 \to s_1 1 s_1, s_1 \to s_2 0, s_2 \to 11\}$.

Reduction Rule 5. Let G be an admissible grammar in which two variables s and s' represent the same substring of the A-sequence represented by G. Reduce G to the grammar G' obtained by replacing each appearance of s' in the range of G by s and deleting the production rule corresponding to s'. The grammar G' may not be admissible since some G'-variables may not be involved in the whole parallel replacement process of G'. If so, further reduce G' to the admissible grammar G" obtained by deleting all production rules corresponding to variables of G' that are not involved in the whole parallel replacement process of G'. Both G and G" represent the same sequence from A.

Embodiment 1

The grammar transform according to a preferred embodiment will now be described. Let $x=x_1x_2 \ldots x_n$ be a sequence from A which is to be compressed. The irreducible grammar transform is a greedy one in that it parses the sequence x sequentially into non-overlapping substrings $\{x_1, x_2 \ldots x_{n_2}, \ldots, x_{n_{t-1}+1} \ldots x_{n_t}\}$ and builds sequentially an irreducible grammar $G_i$ for each $x_1 \ldots x_{n_i}$, where $1 \leq i \leq t$, $n_1=1$, and $n_t=n$. The first substring is $x_1$ and the corresponding irreducible grammar $G_1$ consists of only one production rule $s_0 \rightarrow x_1$. Suppose that $x_1, x_2 \ldots x_{n_2}, \ldots, x_{n_{i-1}+1} \ldots x_{n_i}$ have been parsed off and the corresponding irreducible grammar $G_i$ for $x_1 \ldots x_{n_i}$ has been built. Suppose that the variable set of $G_i$ is equal to $S(j_i)=\{s_0, s_1, \ldots, s_{j_i-1}\}$, where $j_1=1$. The next substring $x_{n_i+1} \ldots x_{n_{i+1}}$ is the longest prefix of $x_{n_i+1} \ldots x_n$ that can be represented by $s_j$ for some $0<j<j_i$ if such a prefix exists. Otherwise, $x_{n_i+1} \ldots x_{n_{i+1}} = x_{n_i+1}$ with $n_{i+1}=n_i+1$. If $n_{i+1}-n_i>1$ and $x_{n_i+1} \ldots x_{n_{i+1}}$ is represented by $s_j$, then append $s_j$ to the right end of $G_i(s_0)$; otherwise, append the symbol $x_{n_i+1}$ to the right end of $G_i(s_0)$. The resulting grammar is admissible, but not necessarily irreducible. Apply Reduction Rules 1–5 to reduce the grammar to an irreducible grammar $G_{i+1}$. Then $G_{i+1}$ represents $x_1 \ldots x_{n_{i+1}}$. Repeat this procedure until the whole sequence x is processed. Then the final irreducible grammar $G_t$ represents x.

FIG. 1 illustrates the functional blocks of the proposed grammar transform. Using parameters $S(j_i)=\{s_0, s_1, \ldots, s_{j_i-1}\}$ and $n_i$ indicated at 7 and 8, the parser 5 parses off the next phrase $x_{n_i+1} \ldots x_{n_{i+1}}$ and then outputs the symbol $\beta_{i+1} \in A \cup (S(j_i) - \{s_0\})$ which represents the phase $x_{n_i+1} \ldots x_{n_{i+1}}$. After receiving $\beta_{i+1}$, the grammar updation operation 6 reduces the appended grammar $G_i$ into the irreducible grammar $G_{i+1}$ and then sends the information regarding $S(j_{i+1})$ and $n_{i+1}$ back to the parser. The following example shows how the proposed grammar transform works.

EXAMPLE 6

Let $A=\{0, 1\}$ and $x=10011100010001110001111111000$. Apply the above irreducible grammar transform to x. It is easy to see that the first three parsed substrings(or phrases) are 1, 0, and 0. The corresponding irreducible grammars $G_1$, $G_2$, and $G_3$ are given by $\{s_0 \rightarrow 1\}$, $\{s_0 \rightarrow 10\}$, and $\{s_0 \rightarrow 100\}$, respectively. Since $j_3=1$, the fourth parsed phrase is $x_4=1$. Appending the symbol 1 to the end of $G_3(s_0)$ gives rise to an admissible grammar $G'_3$ given by $\{s_0 \rightarrow 1001\}$. $G'_3$ itself is irreducible; so none of Reduction Rules 1 to 5 can be applied and $G_4$ is equal to $G'_3$. Similarly, the fifth and sixth parsed phrases are $x_5=1$ and $x_6=1$, respectively; $G_5$ and $G_6$ are given respectively by $\{s_0 \rightarrow 10011\}$ and $\{s_0 \rightarrow 100111\}$. The seventh parsed phrase is $x_7=0$. Appending the symbol 0 to the end of $G_6(s_0)$ yields an admissible grammar $G'_6$ given by $s_0 \rightarrow 1001110$.

$G'_6$ is not irreducible any more since there is a non-overlapping repeated pattern 10 in the range of $G'_6$. At this point, only Reduction Rule 2 is applicable. Applying Reduction Rule 2 once gives the irreducible grammar $G_7$ given by $s_0 \rightarrow s_1 011 s_1$ $s_1 \rightarrow 10$.

Since the sequence from A represented by $s_1$ is not a prefix of the remaining part of x, the next parsed phrase is $x_8=0$.

Appending the symbol 0 to the end of $G_7(s_0)$ yields an admissible grammar $G'_7$ given by $s_0 \rightarrow s_1 011 s_1 0$ $s_1 \rightarrow 10$.

$G'_7$ is not irreducible. Applying Reduction Rule 2 once, which is the only applicable reduction rule at this point, gives rise to a grammar $G''_7$ $s_0 \rightarrow s_2 11 s_2$ $s_1 \rightarrow 10$ $s_2 \rightarrow s_1 0$.

In the above, the variable $s_1$ appears only once in the range of $G''_7$. Applying Reduction Rule 1 once gives the irreducible grammar $G_8$:

$s_0 \rightarrow s_1 11 s_1$ $s_1 \rightarrow 100$.

From $G_7$ to $G_8$, Reduction Rule 2 followed by Reduction Rule 1 has been applied. Based on $G_8$, the next two parsed phrases are $x_9=0$ and $x_{10}x_{11}x_{12}=100$, respectively. The irreducible grammar $G_9$ is given by $s_0 \rightarrow s_1 11 s_1 0$ $s_1 \rightarrow 100$, and the grammar $G_{10}$ is given by $s_0 \rightarrow s_1 11 s_1 0 s_1$ $s_1 \rightarrow 100$.

Note that from $G_9$ to $G_{10}$, the symbol $s_1$ is appended to the end of $G_9(s_0)$ since the phrase $x_{10}x_{11}x_{12}$ is represented by $s_1$. The eleventh parsed phrase is $x_{13}=0$. Appending 0 to the end of $G_{10}(s_0)$ and then applying Reduction Rule 2 once yield $G_{11}$ $s_0 \rightarrow s_1 11 s_2 s_2$ $s_1 \rightarrow 100$ $s_2 \rightarrow s_1 0$.

The twelfth parsed phrase is $x_{14}=1$ and $G_{12}$ is obtained by simply appending 1 to the end of $G_{11}(s_0)$. The thirteenth parsed phrase is $x_{15}=1$. Appending 1 to the end of $G_{12}(s_0)$ and then applying Reduction rule 2 once give rise to $G_{13}$ $s_0 \rightarrow s_1 s_3 s_2 s_2 s_3$ $s_1 \rightarrow 100$ $s_2 \rightarrow s_1 0$ $s_3 \rightarrow 11$.

The fourteenth parsed phrase is $x_{16}x_{17}x_{18}x_{19}=1000$, which is represented by $s_2$. Appending $s_2$ to the end of $G_{13}(s_0)$ and then applying Reduction Rule 2 followed by Reduction Rule 1 gives rise to $G_{14}$ $s_0 \rightarrow s_1 s_3 s_2 s_2 s_3$ $s_1 \rightarrow 100$ $s_2 \rightarrow s_1 0$ $s_3 \rightarrow 11 s_2$.

The fifteenth parsed phrase is $x_{20}=1$, and $G_{15}$ is obtained by appending 1 to the end of $G_{14}(s_0)$. The sixteenth parsed phrase is $x_{21}=1$. Appending 1 to the end of $G_{15}(s_0)$ and then applying Reduction Rule 3 once result in $G_{16}$ $s_0 \rightarrow s_1 s_3 s_2 s_3 s_4$ $s_1 \rightarrow 100$ $s_2 \rightarrow s_1 0$ $s_3 \rightarrow s_4 s_2$ $s_4 \rightarrow 11$.

The seventeenth parsed phrase is $x_{22}x_{23}=11$ and $G_{17}$ is obtained by appending $s_4$ to the end of $G_{16}(s_0)$. The final parsed phrase is $x_{24} \ldots x_{29}=111000$ and $G_{18}$ is obtained by appending $s_3$ to the end of $G_{17}(s_0)$. In summary, the proposed irreducible grammar transform parses x into {1, 0, 0, 1, 1, 1, 0, 0, 0, 100, 0, 1, 1, 1000, 1, 1, 11, 111000} and transforms x into the irreducible grammar $G_{18}$ $s_0 \to s_1 s_3 s_2 s_3 s_4 s_4 s_3$ $s_1 \to 100$ $s_2 \to s_1 0$ $s_3 \to s_4 s_2$ $s_4 \to 11$.

It is apparent from Example 6, to get $G_{i+1}$ from the appended $G_i$, Reduction Rules 1 to 3 are employed. Furthermore, the order by which these rules are applied is unique, and the number of times these rules need to be applied is at most 2. This phenomenon is true not only for Example 6, but also for all other sequences.

Figure 2:
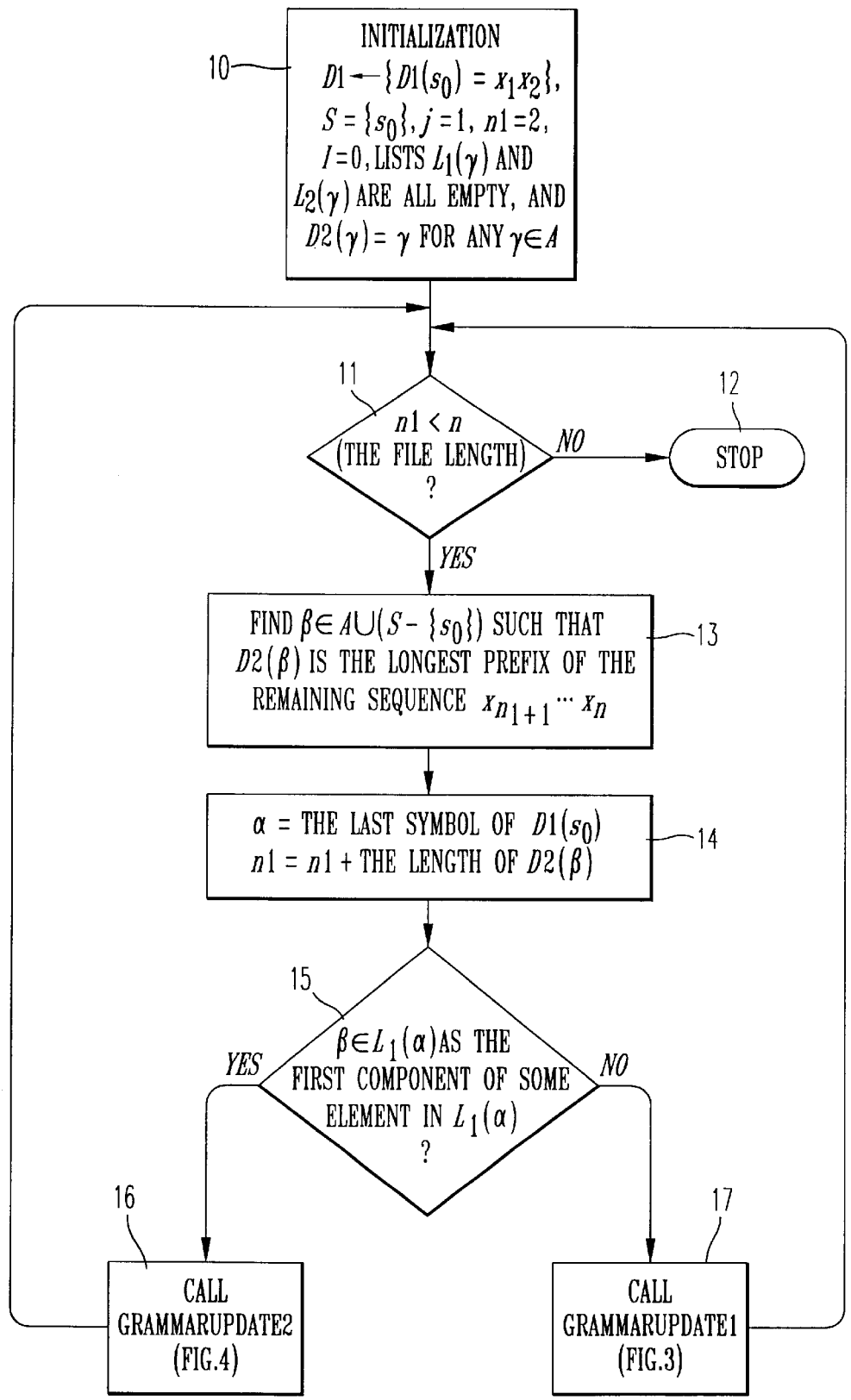
FIGS. 2, 3 and 4 are flow charts illustrating a sequence of operations for a grammar transform in accordance with an embodiment of the present invention.
Figure 3:
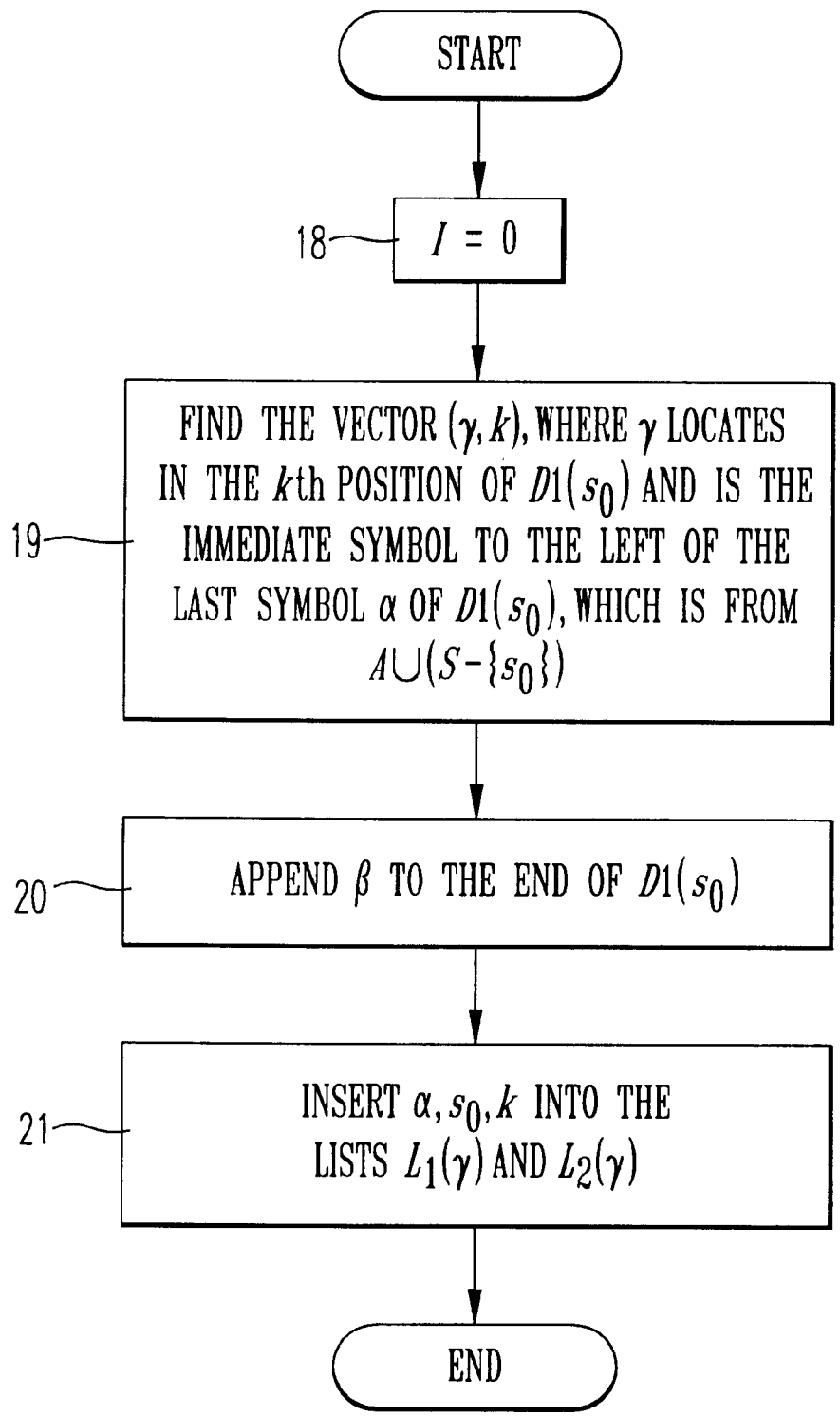
Figure 4:
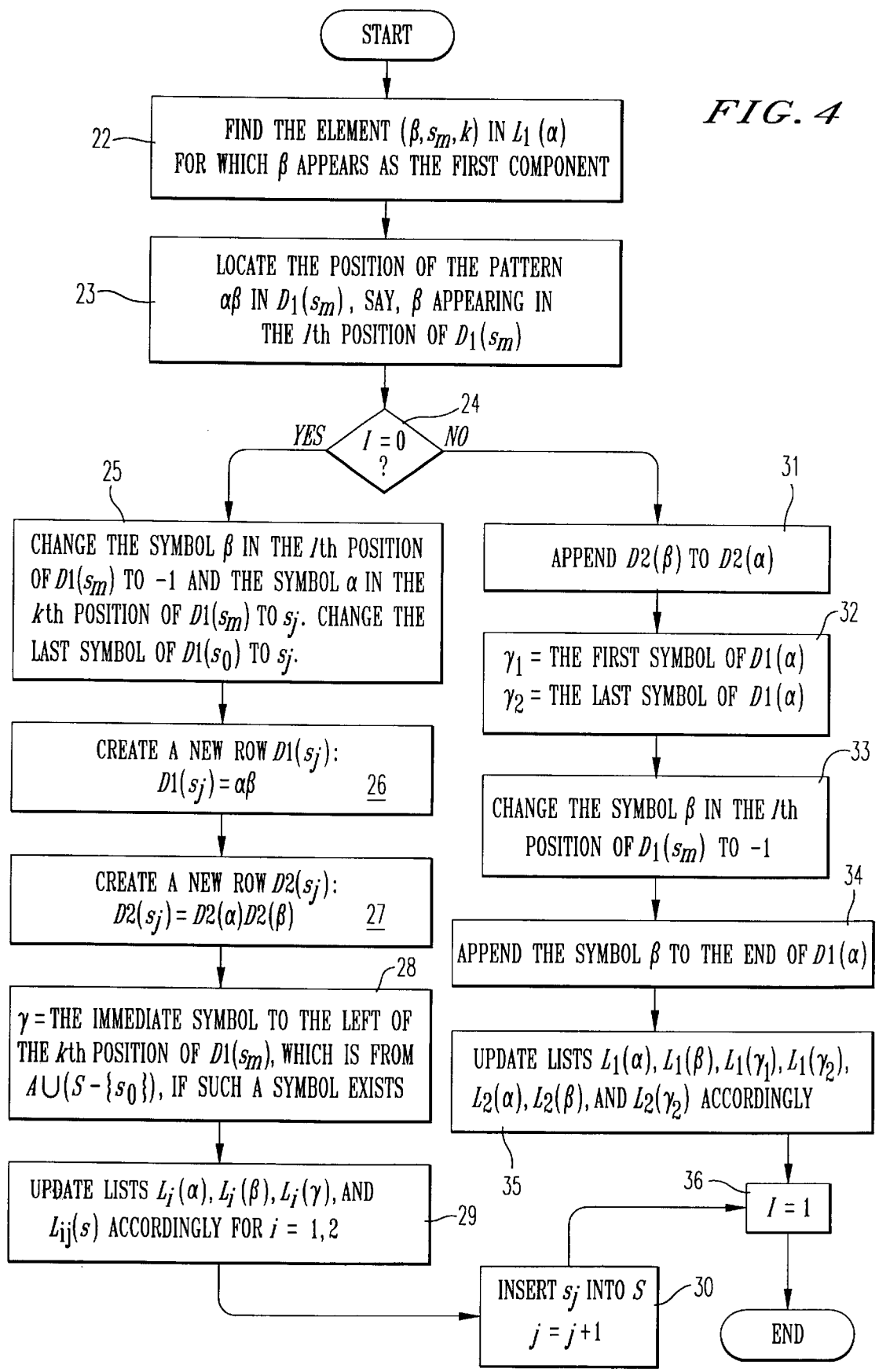

FIGS. 2, 3 and 4 are flow diagrams illustrating the implementation of the grammar transform in accordance with a preferred embodiment of the present invention. Let $G'_i$ denote the appended $G_i$. In view of the above, there are two major operations in the grammar transform: the parsing of x into non-overlapping substrings $\{x_1, x_2 \ldots x_{n_2}, \ldots, x_{n_{t-1}+1} \ldots x_{n_t}\}$ and the updating of $G_i$ into $G_{i+1}$ through $G'_i$, i=1, 2, ..., t−1. Before presenting the implementation details of these operations, let us first describe how to represent $G_i$.

To represent each $G_i$, two dynamic two dimensional arrays are allocated: a symbol array D1 and a string array D2. Let $D1(s_j)$ and $D2(s_j)$ denote the rows of D1 and D2 corresponding to $s_j$, respectively, where $0 \leq j \leq j_i - 1$. The row D1 $(s_j)$ is used to retain the information regarding $G_i(s_j)$, and the row $D2(s_j)$ is used to retain the A-string represented by $s_j$. Since A is assumed to be $\{0, 1, \ldots, |A|-1\}$, the variable $s_j$ can be represented conveniently by the integer $j+|A|$. The row $D1(s_j)$ consists of symbols from $\{-1\} \cup A \cup \{s_0, s_1, \ldots\}$. The row D1 $(s_j)$ itself is not equal to $G_i(s_j)$; however, with the removal of the special symbol −1 from $D1(s_j)$, the modified $D1(s_j)$ is then exactly the same as $G_i(s_j)$. The introduction of the special symbol −1 enables us to update $G_i$ into $G_{i+1}$ by locally changing several elements in the two dimensional symbol array D1, thus reducing the computational time spent in the process of updating $G_i$ into $G_{i+1}$. Conceptually, the special symbol −1 can be considered as the empty string.

The implementation of the parsing operation is illustrated in Blocks 10 to 13 of FIG. 2. Initially, for any $\gamma \in A$, $D2(\gamma)$ denotes the letter $\gamma$ itself. Given the irreducible grammar $G_i$ for $x_1 \ldots x_{n_i}$, the next parsed phrase $x_{n_i+1} \ldots x_{n_{i+1}}$ is the longest prefix of the remaining sequence $x_{n_i+1} \ldots x_n$ that is equal to $D2(\beta)$ for some $\beta \in A \cup (S(j_i) - \{s_0\})$. In other words, to parse off the next phrase, one simply needs to find $\beta \in A \cup (S(j_i) - \{s_0\})$ such that $D2(\beta)$ is the longest prefix of the remaining sequence over $A \cup (S(j_i) - \{s_0\})$. Store all strings $D2(\gamma)$, $\gamma \in A \cup (S(j_i) - \{s_0\})$, into a trie structure. Then one can find β by simply using the remaining sequence to traverse the trie structure.

The implementation of the updating operation is illustrated in Blocks 14 to 17 of FIG. 2, in FIG. 3, and in FIG. 4. To facilitate the updating process, notions of an index function and lists are introduced. An index function I: $\{1, 2, \ldots, t\} \to \{0, 1\}$ is defined as follows: I(1)=0, and for any i>1, I(i) is equal to 0 if $G_i$ is equal to the appended $G_{i-1}$, and 1 otherwise. In flow diagrams shown in FIGS. 2 through 4, this index function is represented by the symbol I which is initialized to be 0 in Block 10 of FIG. 2. Let α be the last integer in $D1(s_0)$; α is furnished in Block 14 of FIG. 2, where n1 represents the total length of all previously parsed substrings. Let β be the symbol from $A \cup (S(j_i) - \{s_0\})$ that represents the next parsed phrase $x_{n_i+1} \ldots x_{n_{i+1}}$; β is furnished in Block 13 of FIG. 2. The pattern αβ is the only possible non-overlapping repeated pattern of length $\geq 2$ in $G'_i$. Furthermore, if αβ is a non-overlapping repeated pattern in the range of $G'_i$, then αβ repeats itself only once in the range of $G'_i$ since $G_i$ is irreducible. To find out whether or not αβ is a non-overlapping repeated pattern and, if it is, where it repeats itself, two lists $L_1(\gamma)$ and $L_2(\gamma)$ are allocated to each symbol $\gamma \in \{0, 1, \ldots |A|-1, |A|+1, \ldots, j_i+|A|-1\}$. The list $L_1(\gamma)$ consists of all vectors $(\eta, s_m, n)$, where $\eta \in A \cup \{s_1, \ldots, s_{j_i-1}\}$, and n is an integer, such that (a.1) γ is the nth element in $D1(s_m)$.

(a.2) η is the first element in $D1(s_m)$ which appears after the nth position and is riot equal to −1.

(a.3) When $s_m = s_0$, i.e., when m=0, η does niot locate in the last position of $D1(s_0)$.

(a.4) With the removal of all possible −1 from $D1(s_m)$, the modified $D1(s_m)$ is not equal to γη.

(a.5) When γ=η and when there is a pattern γγγ appearing in the modified $D1(s_m)$, n is not equal to the position of the first γ of the pattern in $D1(s_m)$.

The list $L_2(\gamma)$ consists of all vectors $(\eta, s_m, n)$ such that Properties (a.1) to (a.3) and Property (a.5) hold. Only lists $L_1(\gamma)$ are necessary to perform grammar updation. However, the improved sequential compression algorithm described later uses both $L_1(\gamma)$ and $L_2(\gamma)$ to perform encoding. Elements in the lists $L_1(\gamma)$ and $L_2(\gamma)$ can be arranged in increasing order of η, or can be stored in trie structures. To facilitate discussion, lists $L_1(\gamma)$ and $L_2(\gamma)$ may also be referred to as the sets consisting of all the first components of elements in $L_1(\gamma)$ and $L_2(\gamma)$, respectively. Initially, all lists are empty, as shown in Block 10 of FIG. 2. Since $G_i$ is uniquely specified by the two dynamic two dimensional arrays D1 and D2, updating $G_i$ into $G_{i+1}$ is now equivalent to updating the two dynamic arrays D1 and D2. With the help of the lists $L_1(\gamma)$, $\gamma \in \{0, 1, |A|-1, |A|+1, \ldots, j_i+|A|-1\}$, the updating operation can now be implemented as follows.

1 After parsing the substring β from the previously unparsed symbols of the data sequence x, as shown in Blocks 10 to 14 of FIG. 2, it is determined whether or not β appears in the list $L_1$ (α) as the first component of some element in $L_1(\alpha)$. This step is illustrated in Block 15 of FIG. 2.

2 As shown in Blocks 17 to 21 of FIGS. 2 and 3, if β does not appear as the first component of some element in $L_1(\alpha)$, simply append β to the end of $D1(s_0)$, and update the lists $L_1(\gamma)$ and $L_2(\gamma)$ by inserting an additional vector $(\alpha, s_0, n)$, where γ locates in the nth position of the unappended $D1(s_0)$ and is the immediate symbol to the left of the end of the unappended $D1(s_0)$, which is from $A \cup (S(j_i) - \{s_0\})$. In this case, $G_{i+1}$ is equal to $G'_i$, and no new variable is created.

3 If β appears as the first component of some element in $L_1(\alpha)$ and if I(i)=0 (Block 24), then only Reduction Rule 2 or 3 is applicable. Suppose that $(\beta, s_m, k)$ is an element in $L_1(\alpha)$. The vector $(\beta, s_m, k)$ is furnished in Block 22 of FIG. 4. Then the pattern αβ repeats itself only in the kth position of $D1(s_m)$, with β occurring, say, in the lth position of $D1(s_m)$. Any integer occurring between the kth position and the lth position in $D1(s_m)$, if any, is equal to −1. The integer l is computed in Block 23 of FIG. 4. Change the symbol β in the lth position of $D1(s_m)$ to −1, and the symbol α in the kth position of $D1(s_m)$ to the new variable $s_{ji}$, which is equal to $|A|+j_i$. Change the last symbol in $D1(s_0)$, which is α, to be $s_{j_i}$. Create a new row $D1(s_{j_i})$ of D1 to denote the pattern αβ. Update the lists $L_1(\gamma)$ and $L_2(\gamma)$ accordingly (at most, eight lists need to be updated.) Create a new row $D2(s_{j_i})$ of D2 to retain the A-string represented by the new variable $s_{j_i}$. These steps are illustrated in Blocks 25 to 30 of FIG. 4.

4 If β appears as the first component of some element in $L_1(\alpha)$ and if I(i)=1(Block36), then Reduction Rule 2 or 3 followed by Reduction Rule 1 is applicable. In this case, α is the newly created variable $s_{j-1}$, and the list $L_1(\alpha)$ contains only one vector (β, $s_m$, k). The pattern αβ repeats itself only in the kth position of $D1(s_m)$ with β occurring, say, in the lth position of the row $D1(s_m)$. Change the integer β in the lth position of $D1(s_m)$ to −1, and append β to the end of the row D1(α). Update $L_1(\alpha)$, $L_1(\beta)$, and other lists accordingly. (At most, seven lists need to be updated.) Append the A-string represented by β to the end of the row D2(α). These steps are illustrated in Blocks 31 to 35 of FIG. 4.

Embodiment 2

In another embodiment of the present invention, the data sequence x is encoded sequentially by using a zero order arithmetic code with a dynamic alphabet to encode the sequence of parsed phrases $x_1, x_2 \ldots x_{n_2}, \ldots, x_{n_{i-1}+1} \ldots x_{n_i}$. The resulting algorithm is called a sequential algorithm. Specifically, each symbol β∈S∪A is associated with a counter c(β). Initially, c(β) is set to 1 if β∈A and 0 otherwise. At the beginning, the alphabet used by the arithmetic code is A. The first parsed phrase $x_1$ is encoded by using the probability $c(x_1)/\Sigma_{\beta \in A} c(\beta)$. Then the counter $c(x_1)$ increases by 1. Suppose that $x_1, x_2 \ldots x_{n_2}, \ldots, x_{n_{i-1}+1} \ldots x_{n_i}$ have been parsed off and encoded and that all corresponding counters have been updated. Let $G_i$ be the corresponding irreducible grammar for $x_1 \ldots x_{n_i}$. Assume that the variable set of $G_i$ is equal to $S(j_i)=\{s_0, s_1, \ldots, s_{j-1}\}$. Let $x_{n_i+1} \ldots x_{n_{i+1}}$ be parsed off as in the irreducible grammar transform of the present invention and represented by $\beta \in \{s_1, \ldots, s_{j-1}\} \cup A$. Encode $x_{n_i+1} \ldots x_{n_{i+1}}$ (or β) and update the relevant counters according to the following steps:

Step 1: The alphabet used at this point by the arithmetic code is $\{s_1, \ldots, s_{j-1}\} \cup A$. Encode $x_{n_i+1} \ldots x_{n_{i+1}}$ by using the probability $$c(\beta) / \sum_{\alpha \in S(j_i) \cup A} c(\alpha). \tag{1}$$

Step 2: Increase c(β) by 1.
Step 3: Get $G_{i+1}$ from the appended $G_i$ as in our irreducible grammar transform.
Step 4: If $j_{i+1} > j_i$, i. e. , $G_{i+1}$ includes the new variable $s_{j_i}$, increase the counter $c(s_{j_i})$ by 1.

Repeat this procedure until the whole sequence x is processed and encoded.

EXAMPLE 7

The sequential algorithm is applied to compress the sequence x=100111000100011100011111111000 shown in Example 6. It follows from Example 6 that x is parsed into {1, 0, 0, 1, 1, 1, 0, 0, 0, 100, 0, 1, 1, 1000, 1, 1, 11, 111000}. The product of the probabilities used to encode these parsed phrases is $$p = \frac{1}{2} \frac{1}{3} \frac{2}{4} \frac{2}{5} \frac{3}{6} \frac{4}{7} \frac{3}{8} \frac{4}{10} \frac{5}{11} \frac{1}{12} \frac{6}{13} \frac{5}{15} \frac{6}{16} \frac{1}{18} \frac{7}{19} \frac{8}{20} \frac{1}{22} \frac{1}{23}.$$

Figure 5B:
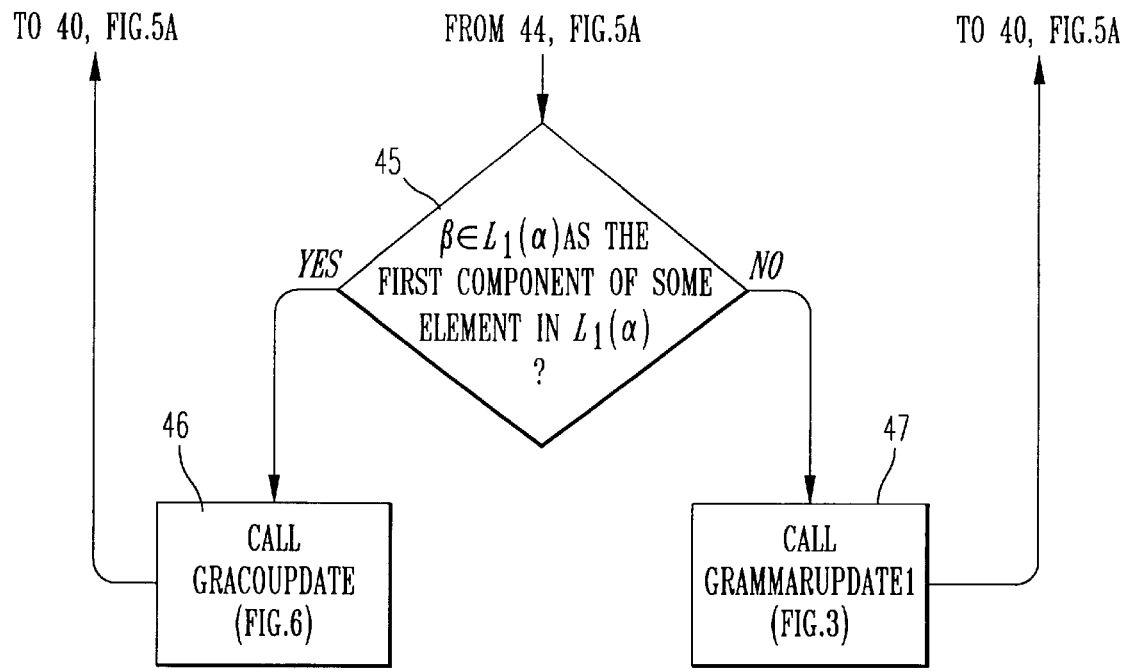
FIGS. 5, 6 and 7 are flow charts illustrating a sequence of operations for sequential compression in accordance with an embodiment of the present invention.
Figure 5A:
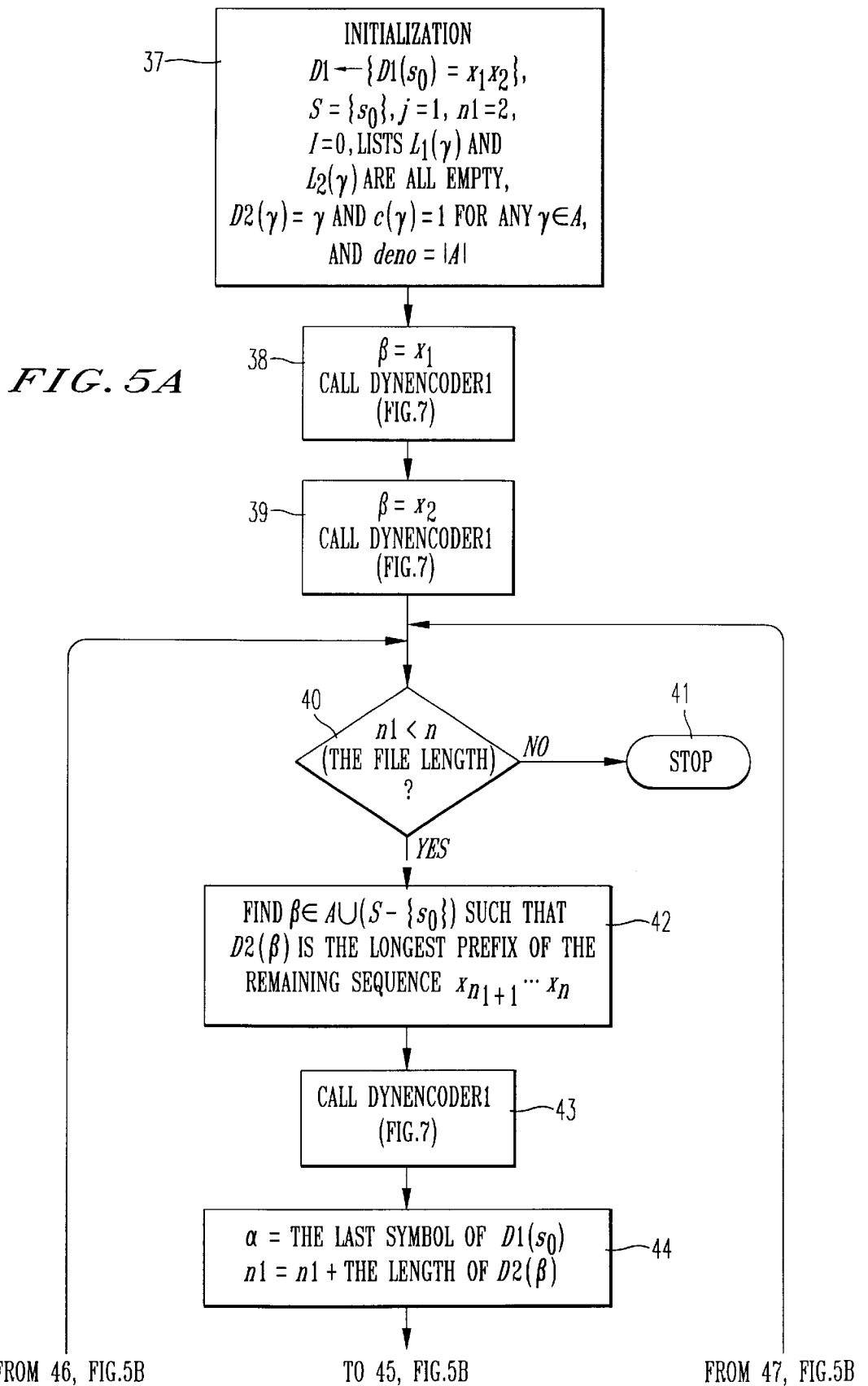
Figure 6:
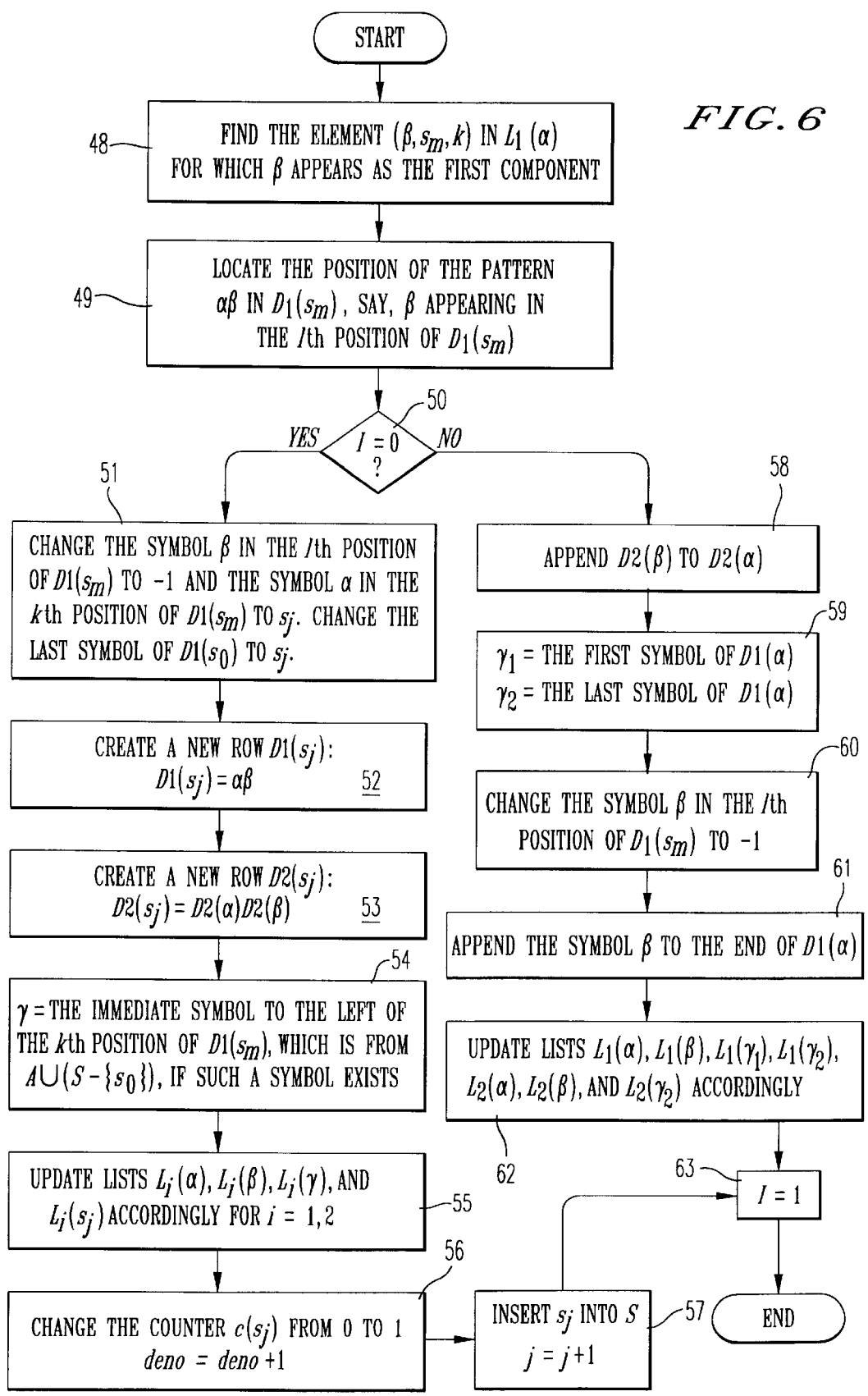
Figure 7:
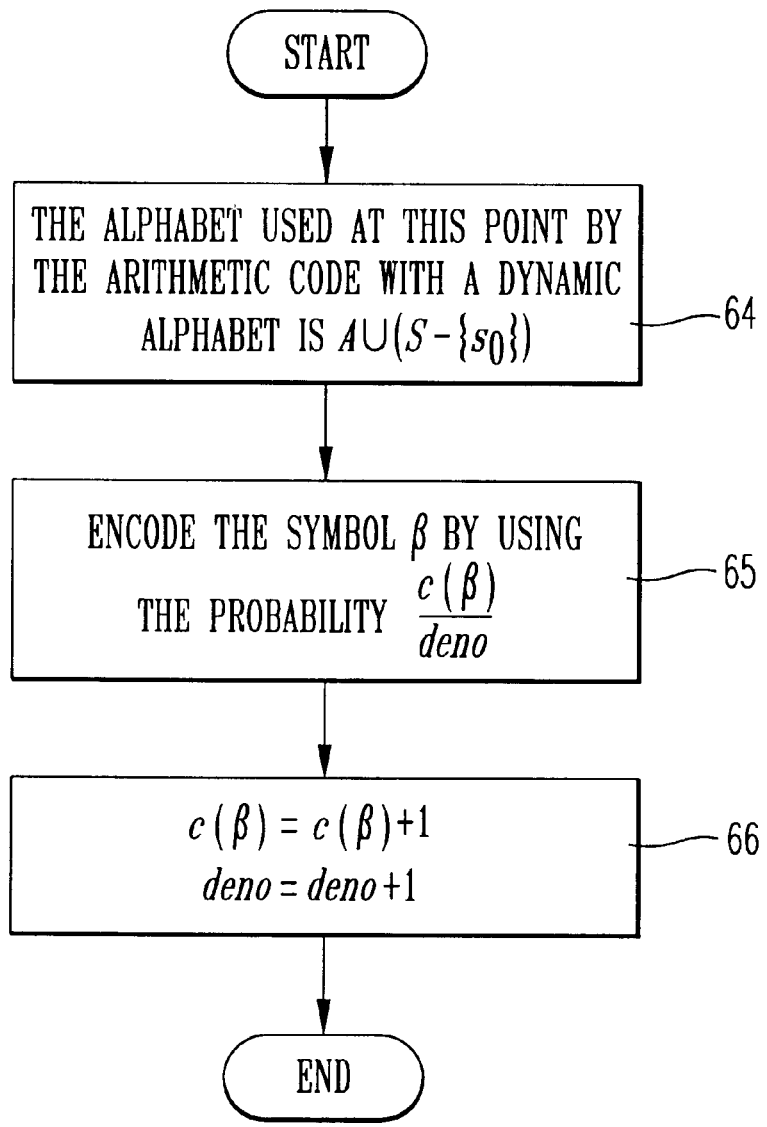

FIGS. 5, 6 and 7 list the functional flow diagrams of the proposed sequential compression algorithm. The parsing, encoding, and updating operations are interleaved. Block 37 of FIG. 5 is essentially the same as Block 10 of FIG. 2; the only difference is that Block 37 contains an additional parameter "deno", which is designated to be the denominator of the fraction number shown in (1) and initialized to be |A|. Blocks 40 to 42, 44, 45, and 47 of FIG. 5 are the same as Blocks 11 to 15, and 17 of FIG. 2, respectively. All blocks of FIG. 6 except Block 56 are the same as those of FIG. 4. Block 56 implements Step 4 above, and also increases the denominator "deno" by 1. Blocks 64 to 66 of FIG. 7 implement Steps 1 and 2 above (i.e., Blocks 38, 39 and 43 of FIG. 5).

Embodiment 3

In a third embodiment of the present invention, the index sequence $\{I(i)\}_{i=1}^{t}$ and the structures of $\{G_i\}_{i=1}^{t}$ are used to improve the encoding of the sequence of parsed phrases $x_1, x_2 \ldots x_{n_2}, \ldots, x_{n_{i-1}+1} \ldots x_{n_i}$. The resulting algorithm is called an improved sequential algorithm. The sequence $\{I(i)\}_{i=1}^{t}$ itself is encode by an order 1 arithmetic code. In addition to the counters c(γ), γ∈S∪A, new counters c(0, 0), c(0, 1), c(1, 0), c(1, 1) and ĉ(γ) are defined. The counters c(0, 0), c(0, 1), c(1, 0), and c(1, 1) are used to encode the sequence $\{I(i)\}_{i=1}^{t}$; initially, they are all equal to 1. The (i+1)th parsed phrase is encoded by the counters ĉ(γ) whenever I(i)=0 and I(i+1)=1 and by the counters c(γ) whenever I(i+1)=0. As in the case of c(γ), initially ĉ(γ) is 1 if γ∈A and 0 if γ∈S. The first three parsed phrases are encoded as in the sequential algorithmrr since they are $x_1, x_2$, and $x_3$. Also, I(1), I(2), and I(3) are all 0 and hence there is no need to encode them. Starting from the fourth phrase, we first encode I(i+1), and then use I(i+1) as side information and the structure of $G_i$ as context information to encode the (i+1)th parsed phrase. Suppose that $x_1, x_2 \ldots x_{n_2} \ldots x_{n_{i-1}+1} \ldots x_{n_i}$ and I(4), . . . , I(i) have been encoded and that all corresponding counters have been updated. Let $G_i$ be the corresponding irreducible grammar for $x_1 \ldots x_{n_i}$. Assume that the variable set of $G_i$ is equal to $S(j_i)=\{s_0, s_1, \ldots, S_{j-1}\}$. Let ae be the last symbol of $G_i(s_0)$. Let $x_{n_i+1} \ldots x_{n_{i+1}}$ be parsed off as in our irreducible grammar transform and represented by $\beta \in \{s_1, \ldots, s_{j-1}\} \cup A$. Encode I(i+1) and β, and update the relevant counters according to the following steps:

Step 1: Encode I(i+1) by using the probability $$c(I(i),I(i+1))/(c(I(i),0)+c(I(i),1)).$$

Step 2: Increase c(I(i), I(i+1)) by 1.
Step 3: If I(i+1)=0, encode β by using the probability $$c(\beta) / \sum_{\gamma \in S(j_i) \cup A - L_2(\alpha)} c(\gamma), \tag{2}$$

and then increase c(β) by 1. If I(i)=0 and I(i+1)=1, encode β by using the probability $$\hat{c}(\beta) / \sum_{\gamma \in L_1(\alpha)} \hat{c}(\gamma), \tag{3}$$

and then increase ĉ(β) by 1. On the other hand, if I(i)=1 and I(i+1)=1, no information is sent since $L_1(\alpha)$ contains only one element and the decoder knows what β is.

Step 4: Get $G_{i+1}$ from the appended $G_i$ as in our irreducible grammar transform. Update $L_1(\gamma)$ and $L_2(\gamma)$ accordingly, where $\gamma \in S(j_{i+1}) \cup A$.

Step 5: If $j_{i+1} > j_i$, i.e., $G_{i+1}$ includes the new variable $s_{j_i}$, increase both $c(s_{j_i})$ and $\hat{c}(s_{j_i})$ by 1.

Repeat this procedure until the whole sequence x is processed and encoded.

In Step 3 above, $L_1(\gamma)$ and $L_2(\gamma)$ are considered as the sets consisting of all the first components of elements in $L_1(\gamma)$ and $L_2(\gamma)$, respectively.

EXAMPLE 7

The improved sequential algorithm is applied to compress the sequence x=100111000100011100011111111000 shown in Example 6. It follows from Example 6 that x is parsed into {1, 0, 0, 1, 1, 1, 0, 0, 0, 100, 0, 1, 1, 1000, 1, 1, 11, 111000}. The corresponding sequence {I(i)} is 000000110010110100. The product of the probabilities used to encode the sequence $\{I(i)\}_{i=4}^{18}$ is $$\frac{1}{2}\frac{2}{3}\frac{3}{4}\frac{1}{5}\frac{1}{2}\frac{1}{3}\frac{4}{6}\frac{2}{7}\frac{2}{4}\frac{3}{8}\frac{2}{5}\frac{3}{6}\frac{4}{9}\frac{4}{7}\frac{5}{10}.$$

The product of the probabilities used to encode the parsed phrases is $$\frac{1}{2}\frac{1}{3}\frac{2}{4}\frac{2}{5}\frac{3}{3}\frac{4}{4}\frac{1}{2}\frac{3}{4}\frac{1}{6}\frac{2}{3}\frac{5}{12}\frac{1}{5}\frac{6}{13}\frac{2}{5}\frac{1}{15}\frac{1}{16}.$$

Note that the (i+1)th parsed phrase need not be encoded whenever I(i)=1 and I(i+1)=1.

Figure 8A:
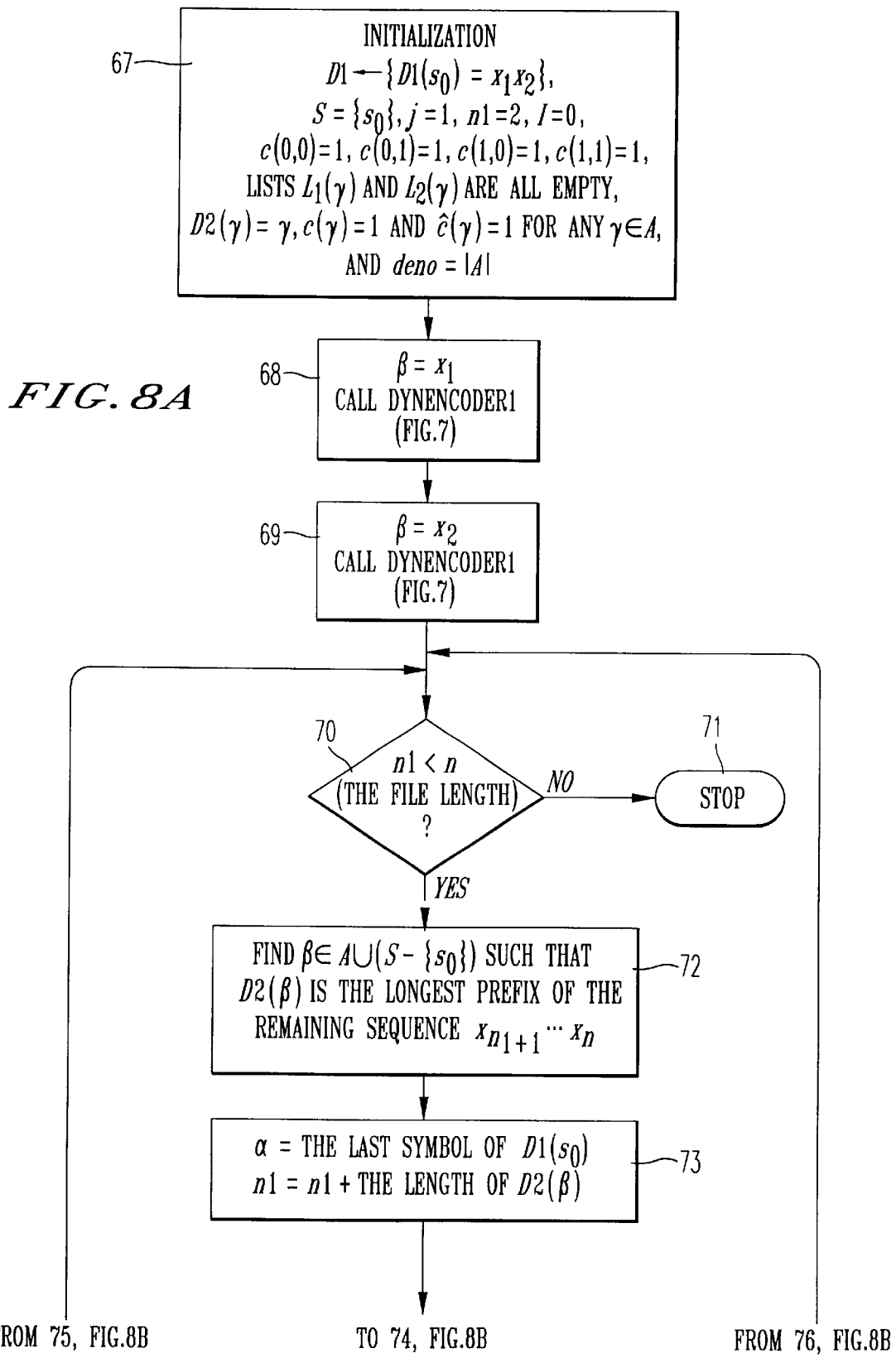
FIGS. 8, 9, 10, 11 and 12 are flow charts illustrating a sequence of operations for sequential compression in accordance with an embodiment of the present invention.
Figure 8B:
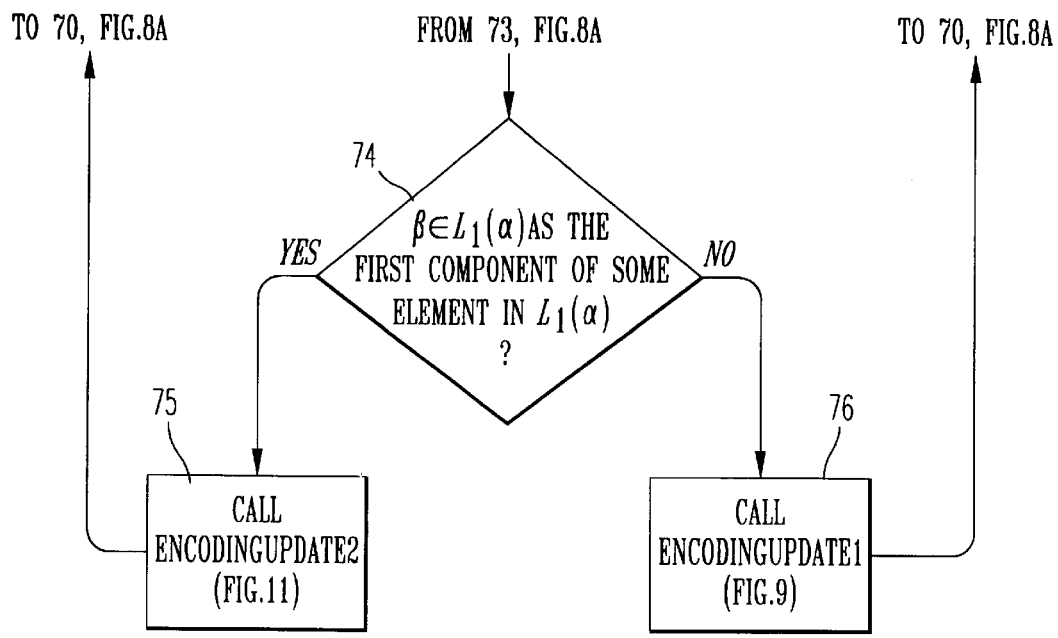
Figure 10:
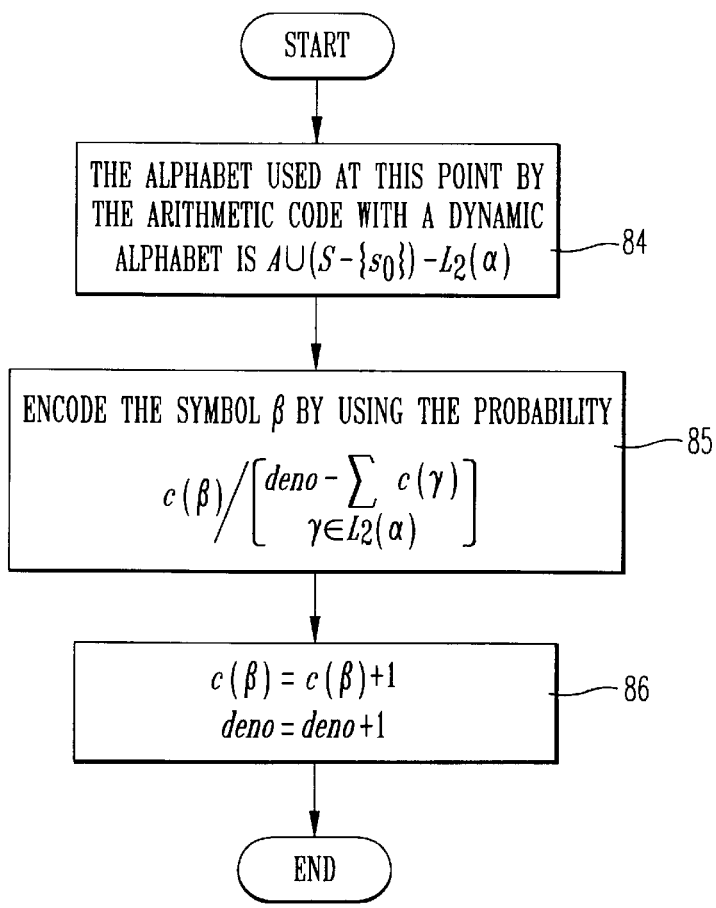
Figure 9:
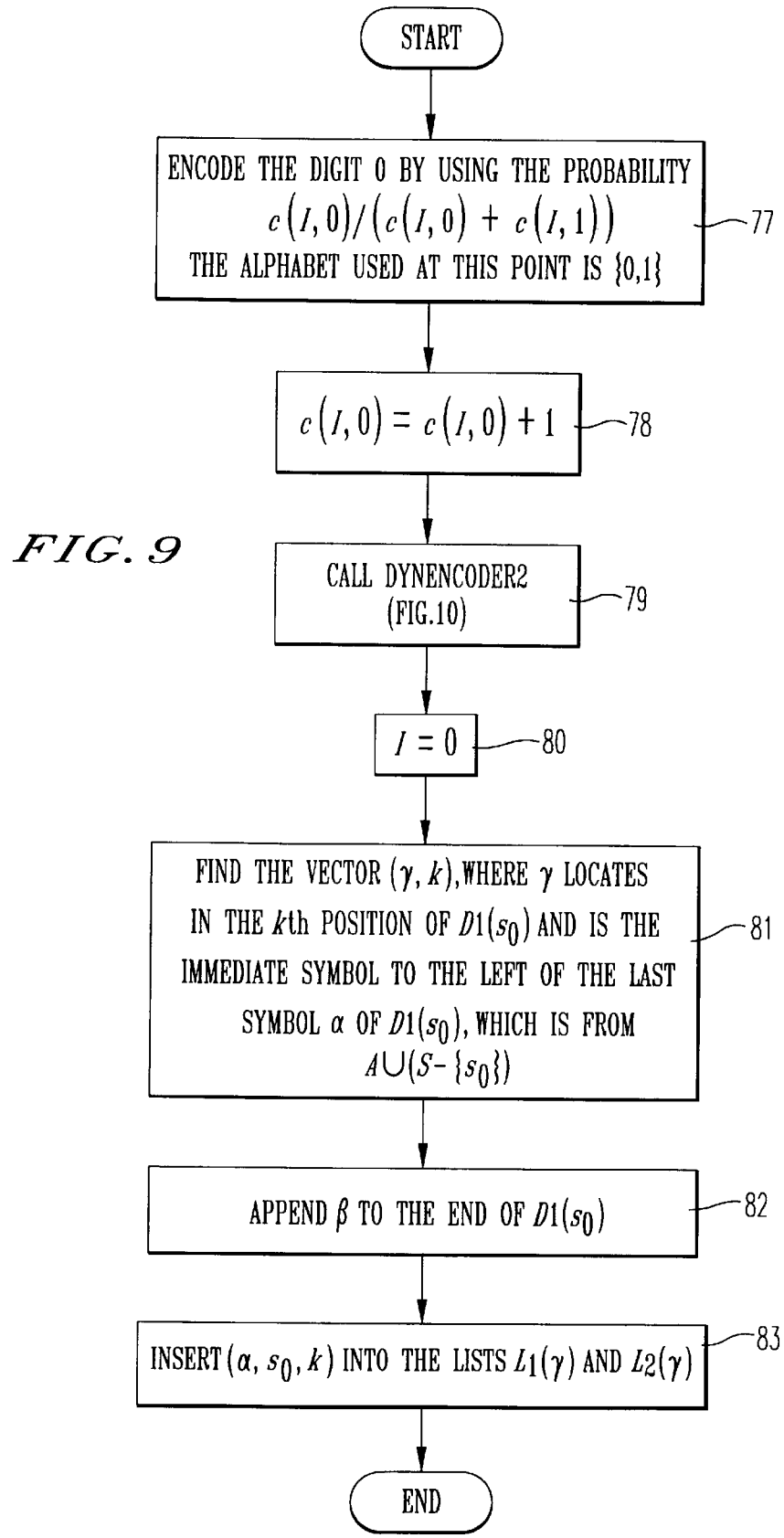
Figure 11:
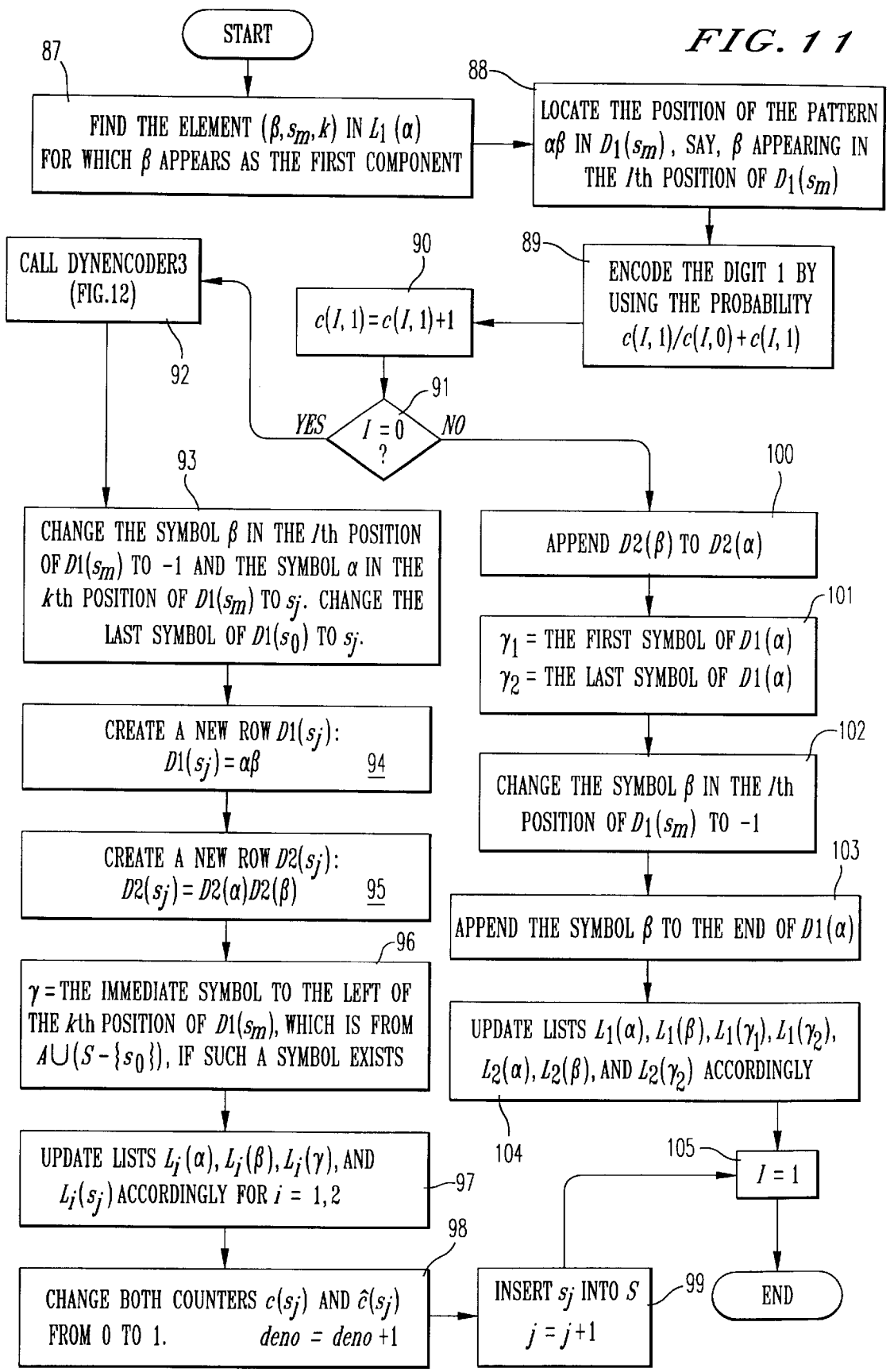
Figure 12:
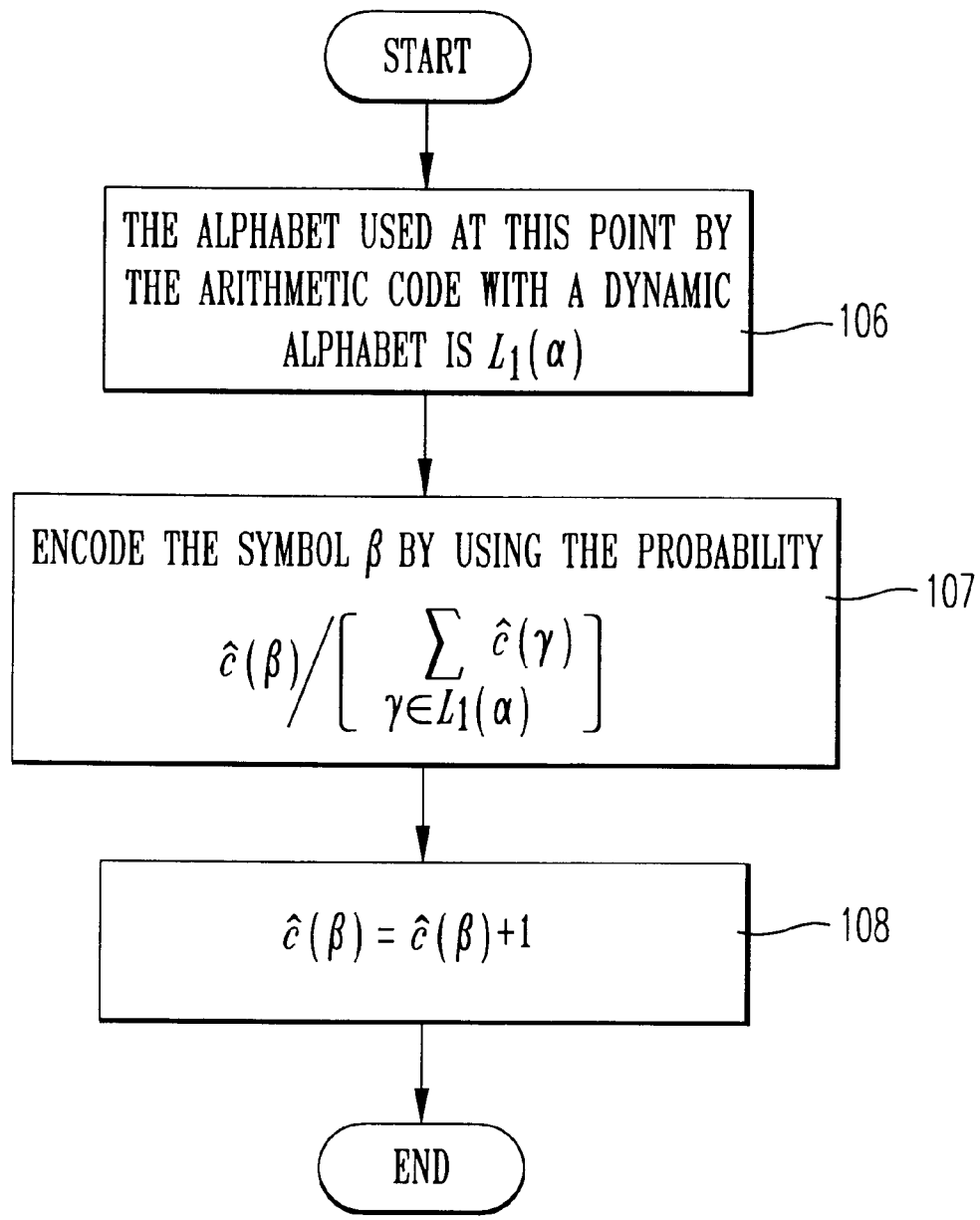

FIGS. 8 through 12 list the functional flow diagrams of the improved sequential compression algorithm. Once again, the parsing, encoding, and updating operations are interleaved. Block 67 of FIG. 8 initializes all parameters which, in addition to the parameters listed in Block 37 of FIG. 5, includes new parameters c(0, 0), c(0, 1), c(1, 0), c(1, 1), and $\hat{c}(\gamma)$. Blocks 70 to 74 of FIG. 8 are the same as Blocks 11 to 15 of FIG. 2. Blocks 77 and 78 of FIG. 9 implement Steps 1 and 2 above in the case of I(i+1)=0. Blocks 79, and 84 to 86 of FIGS. 9 and 10 encode the parsed phrase β in the case of I(i+1)=0. Blocks 80 to 83 of FIG. 9 are the same as those of FIG. 3. All blocks in FIG. 11 except Blocks 89, 90, 92, and 98 are the same as those of FIG. 4. Blocks 89 and 90 implement Steps 1 and 2 above in the case of I(i+1)=1. Blocks 92, 106 to 108, and 98 encode the parsed phrase β in the case of I(i)=0 and I(i+1)=1.

Embodiment 4

In a fourth embodiment of the present invention, the data sequence x is encoded using a hierarchical encoding method. The resulting algorithm is called a hierarchical compression algorithm. Let x be an A sequence which is to be compressed. Let $G_t$ be the final irreducible grammar for x furnished by our irreducible grammar transform. In the hierarchical algorithm, a zero order arithmetic code with a dynamic alphabet is used to encode $G_t$(or its equivalent form). After receiving the binary codeword, the decoder recovers $G_t$(or its equivalent form) and then performs the parallel replacement procedure mentioned before to get x.

To illustrate how to encode the final irreducible grammar $G_t$, the following example is provided in which t=18. With reference to Block 109 of FIG. 13, $G_{18}$ is furnished by the proposed irreducible grammar transform and given by $s_0 \rightarrow s_1 s_3 s_2 s_3 s_4 s_4 s_3$
$s_1 \rightarrow 100$
$s_2 \rightarrow s_1 0$
$s_3 \rightarrow s_4 s_2$
$s_4 \rightarrow 11$.

The above form of $G_{18}$, however, is not convenient for transmission. To encode $G_{18}$ efficiently, $G_{18}$ is converted into its canonical form $G_{18}^g$ given by $s_0 \rightarrow s_1 s_2 s_3 s_2 s_4 s_4 s_2$
$s_1 \rightarrow 100$
$s_2 \rightarrow s_4 s_3$
$s_3 \rightarrow s_1 0$
$s_4 \rightarrow 11$.

To get $G_{18}^g$ from $G_{18}$, the variable $s_3$ in $G_{18}$ is renamed as $s_2$ in $G_{18}^g$ and the variable $s_2$ in $G_{18}$ is renamed as $s_3$ in $G_{18}^g$. The difference between $G_{18}^g$ and $G_{18}$ is that the following property holds for $G_{18}^g$, but not for $G_{18}$:

(c.1) If $G_{18}^g(s_i)$ is read from left to right and from top(i=0) to bottom(i=4), then for any $j \geq 1$, the first appearance of $s_j$ always precedes that of $s_{j+1}$.

In $G_{18}$, the first appearance of $s_3$ precedes that of $s_2$; this is why these two variables need be renamed to get $G_{18}^g$. Note that both $G_{18}$ and $G_{18}^g$ represent the same sequence x. It is now more convenient to encode and transmit $G_{18}^g$ instead of $G_{18}$. To do $s_o$, concatenate $G_{18}^g(s_0), G_{18}^g(s_1), \ldots, G_{18}^g(s_4)$ in the indicated order, insert the symbol e at the end of $G_{18}^g(s_0)$ and for any $i \geq 1$ satisfying $|G_{18}^g(s_i)| > 2$, insert the symbol b at the beginning of $G_{18}^g(s_i)$ and the symbol e at the end of $G_{18}^g(s_i)$, where symbols b and e are assumed not to belong to S∪A. This gives rise to the following sequence from the alphabet S∪A∪{b, e}:

$$s_1 s_2 s_3 s_2 s_4 s_4 s_2 e b 100 e s_4 s_3 s_1 011 \quad (4)$$

where A {0, 1} in this example. From the sequence given by (4), $G_{18}^g$ can again be obtained. First, $G_{18}^g(s_0)$ can be identified by looking at the first appearance of symbol e. Second, all $G_{18}^g(s_i)$ with $|G_{18}^g(s_i)| > 2$ can be identified by looking at pairs (b,e). Finally, all the other $G_{18}^g(s_i)$ have length 2. A question may arise as to why both symbols e and b are introduced. After all, e can be inserted at the end of each $G_{18}^g(s_i)$ to identify $G_{18}^g(s_i)$. The reason is that most $G_t(s_i)$ of any $G_t$ furnished by the irreducible grammar transform of the present invention have length 2. As a result, by using the pair (b,e) to isolate $G_t(s_i)$ with $|G_t(s_i)| > 2$, a shorter concatenated sequence is obtained and therefore improved compression performance. Since $G_{18}^g$ is canonical, i.e., $G_{18}^g$ satisfies Property (c.1), the first appearance of $s_i$, for any $i \geq 1$, precedes that of $s_{i+1}$ in the sequence given by (4). To take advantage of this in order to get better compression performance, a further step is taken. Let s be a symbol which is not in S∪A∪{b,e}. For each $i \geq 1$, replace the first appearance of $s_i$ in the sequence given by (4) by s. Then the following sequence from S∪A∪{b,e,s} is obtained:

$$ssss_2ss_4s_2eb100es_4s_3s_1011 \quad (5)$$

which is referred to as the sequence generated from $G_{18}$ or its canonical form $G_{18}^g$. As evident from the sequence given by (5), the sequence given by (4) is obtained again by simply replacing the ith s in (5) by $s_i$. Therefore, from the sequence generated from $G_{18}$, $G_{18}^g$ is obtained and hence x. To compress $G_{18}^g$ or x, a zero order arithmetic code with a dynamic alphabet is used to encode the sequence generated from $G_{18}$. Specifically, each symbol β∈S∪A∪{b,e,s} is associated with a counter c(β). Initially, c(β) is set to 1 if β∈A∪{b,e,s} and 0 otherwise. The initial alphabet used by the arithmetic code is A∪{b,e,s}. Encode each symbol β in the sequence generated from $G_{18}$ and update the related counters according to the following steps:

Step 1: Encode $\beta$ by using the probability $$c(\beta) \Big/ \sum_\alpha c(\alpha)$$

where the summation $\Sigma_\alpha$ is taken over $A \cup \{b,e,s\} \cup \{s_1, \ldots, s_i\}$ and i is the number of times that s occurs before the position of this $\beta$. Note that the alphabet used at this point by the arithmetic code is $A \cup \{b,e,s\} \cup \{s_1, \ldots, s_i\}$.

Step 2: Increase the counter $c(\beta)$ by 1.

Step 3: If $\beta=s$, increase the counter $c(s_{i+1})$ from 0 to 1, where i is defined in Step 1.

Repeat the above procedure until the whole generated sequence is encoded. For the generated sequence given by (5), the product of the probabilities used in the arithmetic coding process is $$p = \frac{1}{5}\frac{2}{7}\frac{3}{9}\frac{1}{11}\frac{4}{12}\frac{1}{14}\frac{2}{15}\frac{1}{16}\frac{1}{17}\frac{1}{18}\frac{1}{19}\frac{2}{20}\frac{2}{21}\frac{2}{22}\frac{1}{23}\frac{1}{24}\frac{3}{25}\frac{2}{26}\frac{3}{27}.$$

Figure 13A:
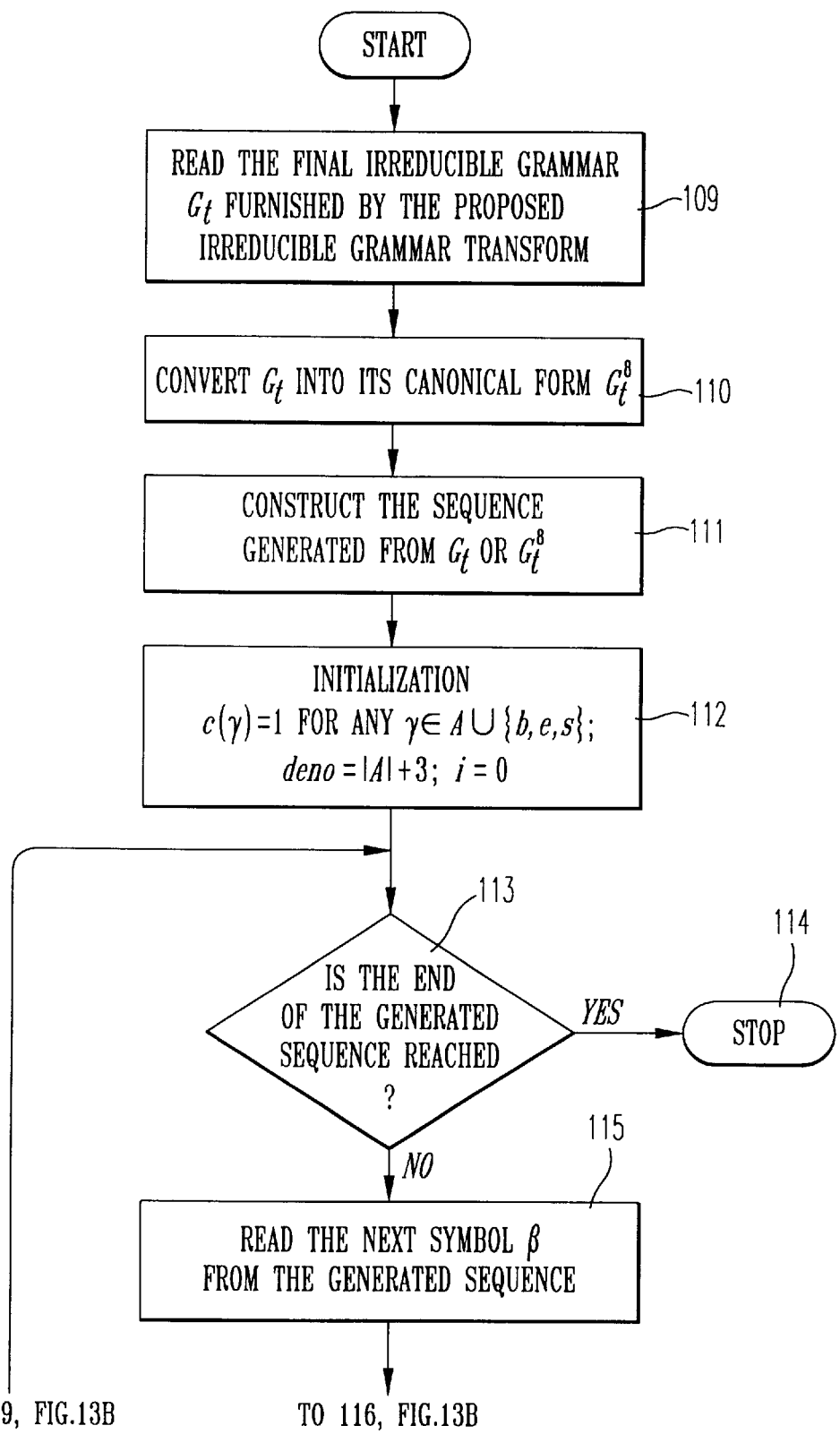
FIG. 13 is a flow chart illustrating a sequence of operations for hierarchical compression in accordance with an embodiment of the present invention.
Figure 13B:
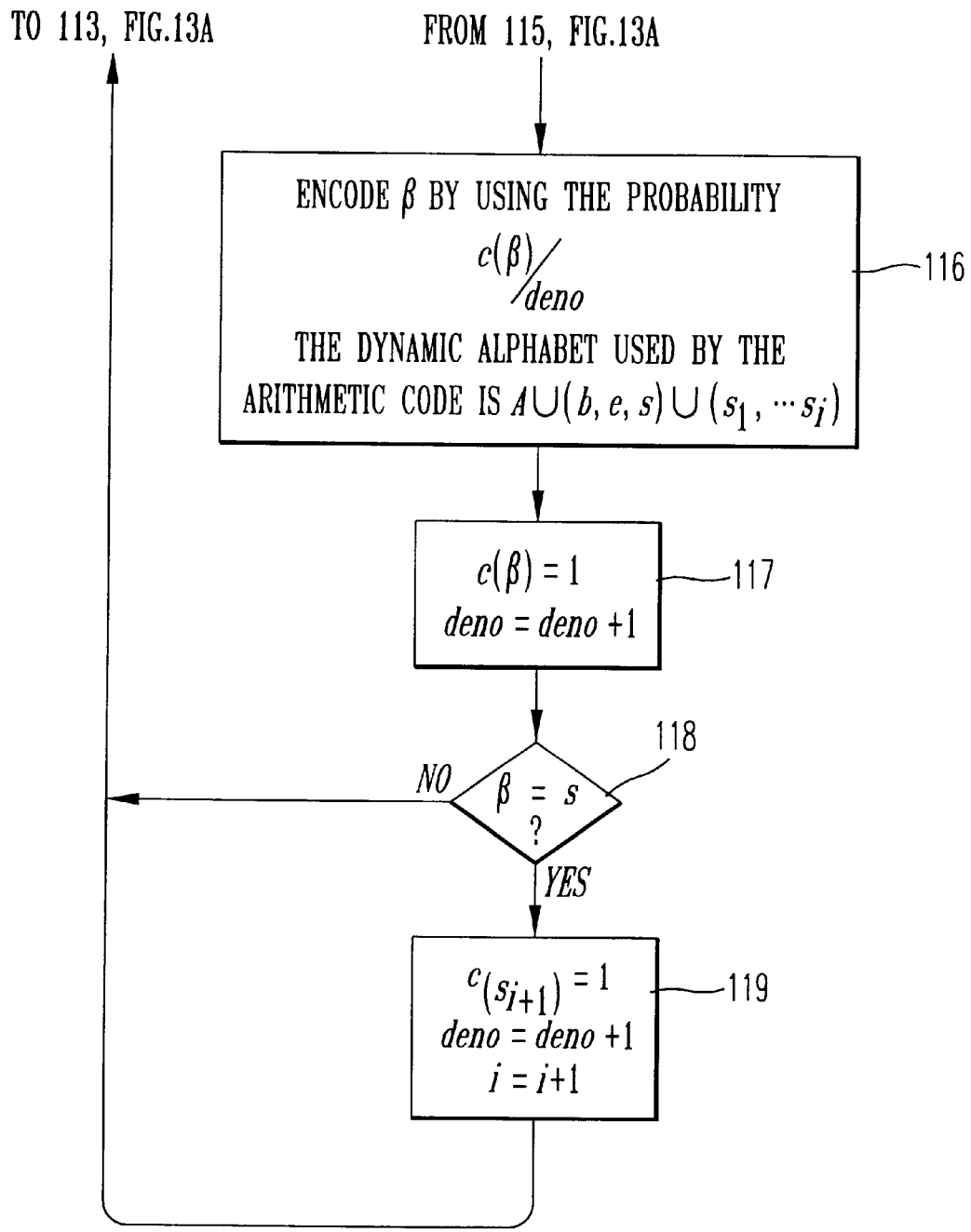

In general, to encode the final irreducible grammar $G_t$, the following procedure is applied with reference to FIG. 13: first convert it into its canonical form $G_t^g$ (Block 110), then construct the sequence generated from $G_t$ (Block 111), and finally use a zero order arithmetic code with a dynamic alphabet to encode the generated sequence.

It should be pointed out that in practice, there is no need to write down explicitly the canonical form $G_t^g$ and the generated sequence before embarking on arithmetic coding. The converting of $G_t$ into $G_t^g$, constructing of the generated sequence, and encoding of the generated sequence can all be done simultaneously in one pass, assuming that $G_t$ has been furnished byour irreducible grammar transform.

FIG. 13 lists the flow diagram of the hierarchical compression algorithm. Steps 1 to 3 above are implemented in Blocks 112 to 119 of FIG. 13.

Although the present invention has been described with reference to preferred embodiments thereof, it will be understood that the invention is not limited to the details thereof. Various modifications and substitutions will occur to those of ordinary skill in the art. All such substitutions are intended to be within the scope of the invention as defined in the appended claims.

What is claimed is:

1. A method of sequentially transforming an original data sequence comprising a plurality of symbols into an irreducible grammar from which the original data can be recovered incrementally, wherein the irreducible grammar is represented by a set of production rules which are formed using from a set of variables representing non-overlapping repeated patterns in the data sequence, the method comprising the steps of:

(a) parsing a substring from the sequence, wherein the substring is a longest prefix of a string of previously unparsed symbols of the sequence that can be represented by a variable within the set of variables of a previous irreducible grammar other than one of a first variable of the set of variables and a first symbol of the string of the previously unparsed symbols in the sequence;

(b) generating an admissible grammar based on the substring and the previous irreducible grammar;

(c) applying at least one of a set of reduction rules to the admissible grammar to generate the irreducible grammar;

(d) repeating steps (a) through (c) until all of the symbols of the sequence are represented by the irreducible granmmar.

2. The method according to claim 1, wherein said applying step further comprises the step of implementing a reduction rule comprising the steps of:

defining s as a variable of an admissible grammar G that appears once in the range of G;

defining a production rule $s' \to \alpha s \beta$ in which s appears on the right of a group of symbols;

defining a production rule $s \to \gamma$ which corresponds to s; and reducing G to an admissible grammar G' by removing said production rule $s \to \gamma$ from G and replacing said production rule $s' \to \alpha s \beta$ with the production rule $s' \to \alpha \gamma \beta$, the resulting admissible grammar G' and G representing an equivalent data sequence.

3. The method according to claim 1, wherein said applying step further comprises the step ofimplementing a reduction rule comprising the steps of:

defining G as an admissible grammar possessing a production rule of form $s \to \alpha_1 \beta \alpha_2 \beta \alpha_3$, the length of $\beta$ being at least 2;

defining $s' \in S$ as a variable which is not a G-variable; and reducing G to the grammar G' by replacing the production rule $s \to \alpha_1 \beta \alpha_2 \beta \alpha_3$ of G with $s \to \alpha_1 s' \alpha_2 s' \alpha_3$, and appending the production rule $s' \to \beta$, the resulting grammar G' having a new variable s' and representing an equivalent data sequence x as G.

4. The method according to claim 3, wherein said reducing step is performed in lieu of other ones of said set of production rules when G' has a non-overlapping repeated pattern of said symbols in the range of G'.

5. The method according to claim 1, wherein said applying step further comprises the step of implementing a reduction rule comprising the steps of:

defining G as an admissible grammar possessing two production rules of form $s \to \alpha_1 \beta \alpha_2$ and $s' \to \alpha_3 \beta \alpha_4$, where $\beta$ is of length at least two, and either of $\alpha_1$ and $\alpha_2$ is not empty, and either $\alpha_3$ and $\alpha_4$ is not empty;

defining $s'' \in S$ as a variable which is not a G-variable; and reducing G to grammar G' by replacing rule $s \to \alpha_1 \beta \alpha_2$ by $s \to \alpha_1 s'' \alpha_2$, replacing rule $s' \to \alpha_3 \beta \alpha_4$ by $s' \to \alpha_3 s'' \alpha_4$, and appending the new rule $s'' \to \beta$.

6. The method according to claim 1, wherein said applying step further comprises the step of implementing a reduction rule comprising the steps of:

defining G as an admissible grammar possessing two production rules of the form $s \to \alpha_1 \beta \alpha_2$ and $s' \to \beta$, where $\beta$ is of length at least two, and either of $\alpha_1$ and $\alpha_2$ is not empty; and reducing G to the grammar G' obtained by replacing said production rule $s \to \alpha_1 \beta \alpha_2$ with said production rule $s \to \alpha_1 s' \alpha_2$.

7. The method according to claim 1, wherein said applying step further comprises the step of implementing a reduction rule comprising the steps of:

defining G as an admissible grammar in which two variables s and s' represent the same substring of an A-sequence represented by G;

reducing G to a grammar G' by replacing each appearance of s' in the range of G by s and deleting a production rule corresponding to s'.

8. The method according to claim 7, wherein said reducing step further comprises the step of further reducing G' to the admissible grammar G" obtained by deleting each said production rules corresponding to variables of G' that are not involved in the parallel replacement process of G' if said grammar G' is not admissible.

9. The method according to claim 1, wherein a list $L_1(\alpha)$ is allocated to said symbols in said substring, said list $L_1(\alpha)$ comprising vectors $(\eta, s_m, n)$, where $\eta \in A \cup \{s_1, \ldots, s_{j_i}-1\}$, n is an integer, and having the following properties:
   (i) $\gamma$ is the nth element in a symbol array $D1(s_m)$,
   (ii) $\eta$ is the first element in said symbol array $D1(s_m)$ which appears after the nth position and is not equal to $-1$,
   (iii) $\eta$ does not locate in the last position of $D1(s_0)$ when $s_m=s_0$, $m=0$,
   (iv) the modified $D1(s_m)$ is not equal to $\gamma\eta$ with the removal of all possible $-1$ from $D1(s_m)$, and
   (v) n is not equal to the position of the first $\gamma$ of the pattern in $D1(s_m)$ wehen $\gamma=\eta$ and when there is a pattern $\gamma\gamma\gamma$ appearing in the modified $D1(s_m)$, and said applying step comprises the step of applying one of a first reduction rule and a second reduction rule if said substring $\beta$ appears as a first component of some element in said list $L_1(\alpha)$ and if a symbol $I(i)=0$,
   said first reduction rule comprising the steps of
      defining G as an admissible grammar possessing a production rule of form $s \to \alpha_1\beta\alpha_2\beta\alpha_3$, the length of $\beta$ being at least 2,
      defining $s' \in S$ as a variable which is not a G-variable, and
      reducing G to the grammar G by replacing the production rule $s \to \alpha_1\beta\alpha_2\beta\alpha_3$ of G with $s \to \alpha_1 s' \alpha_2 s' \alpha_3$, and appending the production rule $s' \to \beta$, the resulting grammar G' having a new variable s' and representing an equivalent data sequence x as G, and
   said second reduction rule comprising the steps of
      defining G as an admissible grammar possessing two production rules of form $s \to \alpha_1\beta\alpha_2$ and $s' \to \alpha_3\beta\alpha_4$, where $\beta$ is of length at least two, and either of $\alpha_1$ and $\alpha_2$ is not empty, and either $\alpha_3$ and $\alpha_4$ is not empty;
      defining $s'' \in S$ as a variable which is not a G-variable, and
      reducing G to grammar G' by replacing rule $s \to \alpha_1\beta\alpha_2$ by $s \to \alpha_1 s'' \alpha_2$, replacing rule $s' \to \alpha_3\beta\alpha_4$ by $s' \to \alpha_3 s'' \alpha_4$, and appending the new rule $s'' \to \beta$.

10. The method according to claim 9, wherein said applying step further comprises the step of implementing a third reduction rule after said one of a first reduction rule and a second reduction rule if said substring $\beta$ appears as a first component of some element in said list $L_1(\alpha)$ and if said symbol $I(i)=1$, said third reduction rule comprising the steps of:
   defining s as a variable of an admissible grammar G that appears once in the range of G;
   defining a production rule $s' \to \alpha s \beta$ in which s appears on the right of a group of symbols;
   defining a production rule $s \to \gamma$ which corresponds to s; and
   reducing G to an admissible grammar G' by removing said production rule $s \to \gamma$ from G and replacing said production rule $s' \to \alpha s \beta$ with the production rule $s' \to \alpha \gamma \beta$, the resulting admissible grammar G' and G representing an equivalent data sequence.

11. The method according to claim 9, wherein said generating step comprises the step of appending said substring $\beta$ to the end of said symbol array $D1(s_0)$ if said substring does not appear as a first component of an element in said list $L_1(\alpha)$.

12. The method according to claim 11, wherein said appending step further comprises the step of updating said list $L_1(\alpha)$ by inserting an additional vector $(\eta, s_m, n)$ where $\gamma$ locates the nth position of the unappended said symbol array $D1(s_0)$ and is the immediate symbol to the left of the end of the unappended said symbol array $D1(s_0)$.

13. The method according to claim 12, wherein said appending step further comprises the step of updating a list $L_2(\alpha)$ comprising vectors $(\eta, s_m, n)$ having said properties (i), (iii) and (v).

14. A method of transforming an original data sequence $x=x_1x_2 \ldots x_n$ comprising a plurality of symbols into a sequence of irreducible grammars $\{G_i\}_{i=1}^t$ from which the original data sequence x can be recovered incrementally, wherein the sequence $x=x_1x_2 \ldots x_n$ has a finite length n and each grammar $G_i$ is represented by a set of production rules $\{s_i \to G(s_i)\}$ formed from a variable set $S(j_i)=\{s_0, s_1, \ldots, s_{j_i-1}\}$ where $j_i$ is an integer greater than or equal to 1 and $j_i=1$, the method comprising the steps of:
   parsing the data sequence $x=x_1x_2 \ldots x_n$ into t non-overlapping substrings $\{x_1, x_2 \ldots x_{n_2}, \ldots, x_{n_{i-1}+1} \ldots x_{n_i}\}$, wherein where i is an integer denoting one of the plurality of non-overlapping substrings, $n_1=1$, $n_t=n$, and each substring $\beta_i$ is a longest prefix of a string of previously unparsed symbols $x_{n_{i-1}+1} \ldots x_n$ of the sequence x that can be represented by a variable $s_j$ within the variable set $S(j_{i-1})=\{s_0, s_1, \ldots, s_{j_{i-1}-1}\}$ of the previous irreducible grammar $G_{i-1}$ for $0<j<j_{i-1}$ or a first symbol $x_{n_{i-1}+1}$ of the string of the previously unparsed symbols in the sequence; and
   generating, for each $1<i \leq t$, an irreducible grammar $G_i$ for each $x_1 \ldots x_{n_i}$ based on each substring $\beta_i=x_{n_{i-1}+1} \ldots x_{n_i}$ and on the previous grammar $G_{i-1}$, where $G_1$ consists of only one production rule $\{s_0 \to x_1\}$.

15. The method according to claim 14, wherein the step of parsing the sequence $x=x_1x_2 \ldots x_n$ into a plurality of non-overlapping substrings $\{x_1, x_2 \ldots x_{n_2}, \ldots, x_{n_{i-1}+1} \ldots x_{n_i}\}$ comprises:
   determining, for each $1<i \leq t$, if a prefix of the remaining unparsed sequence $x_{n_{i-1}+1} \ldots x_n$ can be represented by a variable $s_j$ within the variable set $S(j_{i-1})=\{s_0, s_1, \ldots, s_{j_{i-1}-1}\}$ of the previous irreducible grammar $G_{i-1}$ for $0<j<j_{i-1}$;
   setting a current parsed substring $\beta_i$ to be equal to the longest parsed substring $x_{n_{i-1}+1} \ldots n_{n_i}$ if $x_{n_{i-1}+1} \ldots x_{n_i}$ can be represented by the variable $s_j$; and
   setting the current parsed substring $\beta_i$ to be equal to $x_{n_{i-1}+1}$ with $n_i=n_{i-1}+1$ if $x_{n_{i-1}+1} \ldots x_{n_i}$ can not be represented by the variable $s_j$; and
   wherein the step of determining the irreducible grammar $G_i$ for each $x_1 \ldots x_{n_i}$ based on the substrings $\beta_i$ and the previous grammar $G_{i-1}$ comprises:
      appending the variable $s_j$ to the right end of $G_{i-1}(s_0)$ to generate an admissible grammar $G'_{i-1}(s_0)$ if $n_i-n_{i-1}>1$ and $x_{n_{i-1}+1} \ldots x_{n_i}$ can be represented by the variable $s_j$;
      appending $x_{n_i}$ to the right end of $G_{i-1}(s_0)$ to generate an admissible grammar $G'_{i-1}(s_0)$ if $n_i-n_{i-1}=1$ or $x_{n_{i-1}+1} \ldots x_{n_i}$ can not be represented by a variable $s_j$; and
      applying a set of reduction rules to the admissible grammar $G'_{i-1}(s_0)$ to generate the irreducible grammar $G_i$.

16. A method of sequentially transforming an original data sequence $x=x_1 x_2 \ldots x_n$ comprising a plurality of symbols into a sequence of irreducible grammars $\{G_i\}_{i=1}^{t}$ from which the original data sequence x can be recovered incrementally, wherein n is the number of symbols in the data sequence x, has a finite length, the method comprising the steps of:

parsing a substring $\beta_i$ of unparsed symbols from the data sequence x, wherein the substring $\beta_i = x_{n_{i-1}+1} \ldots x_{n_i}$ wherein i is an integer greater between 1 and t inclusive, t is a total number of substrings parsed from the data sequence x and $n_1=1$;

generating an irreducible grammar $G_i$ for the symbols $x_1 \ldots x_{n_i}$ parsed from the data sequence x based on the substring $\beta_i$ and a previous irreducible grammar $G_{i-1}$ corresponding to a previous substring $\beta_{i-1}$, wherein the irreducible grammar $G_i$ is represented by a set of production rules $\{s_i \rightarrow G(s_i)\}$ formed from a set of variables $S(j_i) = \{s_0, s_1, \ldots, s_{j_i-1}\}$, where each variable in the set of variable represents a string of variables from the symbols $x_1 \ldots x_{n_i}$, $j_i$ is an integer greater than or equal to 1 denoting the number of variables in the variable set $S(j_i)$, $j_1=1$ and $G_1$ consists of only one production rule $\{s_0 \rightarrow x_1\}$; and repeating the above steps until the data sequence x has been parsed into a total of t non-overlapping substrings $\{x_1, x_2 \ldots x_{n_2}, \ldots, x_{n_{t-1}+1} \ldots x_{n_t}\}$ where $n_t=n$ and all of the symbols of the data sequence x are represented by the irreducible grammar $G_t$.

17. The method according to claim 16, wherein the step of parsing a substring $\beta_i$ of symbols from the data sequence x comprises:

determining if a prefix of symbols of a remaining unparsed sequence $x_{n_{i-1}+1} \ldots x_n$ can be represented by a variable $s_j$ within the variable set $S(j_{i-1}) = \{s_0, s_1, \ldots, s_{j_{i-1}-1}\}$ of the previous irreducible grammar $G_{i-1}$ for $0 \leq j < j_{i-1}$;

setting the substring $\beta_i$ parsed from the data sequence x to be equal to $x_{n_{i-1}+1} \ldots x_{n_i}$ if $x_{n_{i-1}+1} \ldots x_{n_i}$ can be represented by the variable $s_j$; and setting the substring $\beta_i$ to be equal to $x_{n_{i-1}+1}$ with $n_i = n_{i-1}+1$ if $x_{n_{i-1}+1} \ldots x_{n_i}$ can not be represented by the variable $s_j$; and wherein the step of determining the irreducible grammar $G_i$ for each $x_1 \ldots x_{n_i}$ based on the substrings $\beta_i$ and the previous grammar $G_{i-1}$ comprises:

appending the variable $s_j$ to the right end of $G_{i-1}(s_0)$ to generate an admissible grammar $G'_{i-1}(s_0)$ if $n_i - n_{i-1} > 1$ and $x_{n_{i-1}+1} \ldots x_{n_i}$ can be represented by the variable $s_j$;

appending $x_{n_i}$ to the right end of $G_{i-1}(s_0)$ to generate an admissible grammar $G'_{i-1}(s_0)$ if $n_i - n_{i-1} = 1$ or $x_{n_{i-1}+1} \ldots x_{n_i}$ can not be represented by a variable $s_j$; and applying a set of reduction rules to the admissible grammar $G'_{i-1}(s_0)$ to generate the irreducible grammar $G_i$.

18. A method of sequentially encoding a data sequence comprising a plurality of symbols, the method comprising the steps of:

(a) parsing a current substring of symbols from the data sequence, wherein the current sutbstring is a longest prefix of symbols of previously unparsed symbols of the data sequence representing a non-overlapping repeated pattern in the data sequence or a first symbol of the string of the previously unparsed symbols in the data sequence;

(b) encoding the current substring based on a dynamic frequency of the current substring, wherein the dynamic frequency is equal to the number of times the current substring has been parsed from the data sequence divided by a sum of the number of times that each previous substring has been parsed from the data sequence; and (c) repeating steps (a) and (b) until all of the symbols of the sequence are encoded.

19. The method according to claim 18, wherein said step (a) further comprises generating an irreducible grammar based on the current substring, wherein the irreducible grammar is represented by a set of production rules which are formed using variables of a variable set each representing a non-overlapping repeated pattern in the data sequence.

20. A method of sequentially transforming a data sequence into a sequence of irreducible grammars and encoding the data sequence based on each of the irreducible grammars, wherein the data sequence comprises a plurality of symbols and the irreducible grammar is represented by a set of production rules which are formed using variables from a variable set, and each variable represents a non-overlapping repeated pattern in the data sequence, the method comprising the steps of:

(a) parsing a current substring of symbols from the sequence, wherein the current substring is a longest prefix of a string of previously unparsed symbols of the sequence that can be represented by a variable within the set of variables corresponding a previous irreducible grammar or a first symbol of the string of the previously unparsed symbols in the sequence;

(b) encoding the current substring based on a dynamic frequency of the current substring, wherein the dynamic frequency is equal to the number of times the current substring has been parsed from the sequence divided by a sum of the number of times that each previous substring has been parsed from the sequence plus the number of variables;

(c) generating an admissible grammar based on the substring and the previous irreducible grammar;

(d) applying a set of reduction rules to the admissible grammar to generate the irreducible,grammar; and (e) repeating steps (a) through (d) until all of the symbols of the sequence are parsed and encoded.

21. A method of sequentially encoding an original data sequence $x=x_1 x_2 \ldots x_n$ comprising a plurality of symbols, the method comprising the steps of:

parsing the sequence $x=x_1 x_2 \ldots x_n$ into a plurality of non-overlapping substrings $\{x_1, x_2 \ldots x_{n_2}, \ldots, x_{n_{i-1}+1} \ldots x_{n_i}\}$, wherein each substring $\beta_i = x_{n_{i-1}+1} \ldots x_{n_i}$ for $1 \leq i \leq t$ where i is an integer denoting one of the plurality of non-overlapping substrings, t is a total number of substrings parsed from the data sequence x, $n_1=1$, and $n_t=n$;

encoding each substring $\beta_i$ based on a dynamic frequency of the substring, wherein the dynamic frequency is equal to the number of times that the substring $\beta_i$ has been parsed from the data sequence x divided by a sum of the number of times that each previously parsed substrings $\beta_1, \ldots, \beta_{i-1}$ have been parsed from the sequence (plus the number of variables); and generating, for each $1 < i \leq t$, an irreducible grammar $G_i$ for each $x_1 \ldots x_{n_i}$ based on each substring $\beta_i = x_{n_{i-1}+1} \ldots x_{n_i}$ and on the previous grammar $G_{i-1}$, where $G_1$ consists of only one production rule.

22. A method of sequentially transforming a data sequence into a sequence of irreducible grammars and encoding the data sequence based on each of the irreducible grammars, wherein the data sequence comprises a plurality of symbols and each of the irreducible grammars is represented by a set of production rules formed from a set of variables each representing a non-overlapping repeated pattern in the data sequence, the method comprising the steps of:

(a) parsing a current substring of symbols from the sequence, wherein the current substring is a longest prefix of a string of previously unparsed symbols of the sequence that can be represented by a variable within the set of variables corresponding a previous irreducible grammar or a first symbol of the string of the previously unparsed symbols in the sequence;

(b) generating an admissible grammar based on the current substring and the previous irreducible grammar;

(c) setting a grammar reduction bit associated with current substring to be equal to one if the admissible grammar is reducible and setting the grammar reduction bit to be equal to zero if the admissible grammar is irreducible;

(d) encoding the grammar reduction bit based on the previous and current values of the grammar reduction bit;

(e) encoding the current substring based on the previous irreducible grammar, the grammar reduction bit and lists representing consecutive pairs of symbols of the previous irreducible grammar using arithmetic coding;

(f) applying a set of reduction rules to the admissible grammar to generate the irreducible grammar; and (g) repeating steps (a) through (f) until all of the symbols of the sequence are parsed and encoded.

23. A method of encoding a data sequence comprising a plurality of symbols, the method comprising the steps of:

(a) transforming the data sequence into an irreducible grammar from which the original data can be recovered incrementally, wherein the irreducible grammar is represented by a plurality of production rules which are formed from a corresponding set of variables each representing a different non-overlapping repeated pattern in the data sequence;

(b) generating a canonical irreducible grammar by converting the irreducible grammar into canonical form;

(c) generating a concatenated sequence by concatenating the production rules of the canonical irreducible grammar; and (d) encoding the concatenated sequence using a zero order arithmetic code with a dynamic alphabet.

24. The method according to claim 23, wherein the step (c) of generating a concatenated sequence further comprises inserting a first symbol at the end of a first production rule.

25. The method according to claim 24, wherein the step (c) further comprises inserting the first symbol at the end of each production rule having a length greater than two and a second symbol at the beginning of each production rule having a length greater than two.

26. The method according to claim 23, wherein the step (a) comprises sequentially parsing a plurality of non-overlapping substrings from the sequence and generating an irreducible grammar based on each substring.

27. A method of encoding an original data sequence x comprising a plurality of symbols, the method comprising the steps of:

parsing the data sequence $x=x_1 x_2 \ldots x_n$ into a plurality of non-overlapping substrings $\{x_1, x_2 \ldots x_{n_2}, \ldots, x_{n_{i-1}+1} \ldots x_{n_i}\}$, wherein each substring $\beta_i = x_{n_{i-1}+1} \ldots x_{n_i}$ for $1 \leq i \leq t$ where i is an integer denoting one of the plurality of non-overlapping substrings, t is a total number of substrings parsed from the data sequence x, $n_1=1$, and $n_t=n$; and generating a sequence of irreducible grammars $\{G_i\}_{i=1}^{t}$ for each $x_1 \ldots x_{n_i}$ based on each substring $\beta_i = x_{n_{i-1}+1} \ldots x_{n_i}$ and on the previous grammar $G_{i-1}$, wherein $G_1$ consists of only one production rule $\{s_0 \to x_1)\}$, each grammar $G_i$ is represented by a set of production rules $\{s_i \to G(s_i)\}$ formed from a variable set $S(j_i)=\{s_0, s_1, \ldots, s_{j-1}\}$, $j_i$ is an integer greater than or equal to 1 and $j_1=1$;

generating a canonical irreducible grammar $G_t^g$ by converting the irreducible grammar $G_t$ into canonical form so that the first appearance $s_j$ always precedes that of $s_{j+1}$;

generating a concatenated sequence of symbols by concatenating the production rules rules $\{s_i \to G(s_i)\}$ of the canonical irreducible grammar; and encoding the concatenated sequence using a zero order arithmetic code with a dynamic alphabet, wherein each symbol β of concatenated sequence is encoded based on a counter c(β) associated with each symbol β which indicates that number of times that each symbol β has occurred in the concatenated sequence.

* * * * *